United States Patent
Tumpold et al.

(10) Patent No.: US 10,367,430 B2
(45) Date of Patent: Jul. 30, 2019

(54) SYSTEM AND METHOD FOR A VARIABLE FLOW TRANSDUCER

(71) Applicant: Infineon Technologies AG, Neubiberg (DE)

(72) Inventors: David Tumpold, Kirchheim b. Meunchen (DE); Alfons Dehe, Reutlingen (DE); Christoph Glacer, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 423 days.

(21) Appl. No.: 14/992,615

(22) Filed: Jan. 11, 2016

(65) Prior Publication Data

US 2017/0201192 A1 Jul. 13, 2017

(51) Int. Cl.
- *H02N 1/00* (2006.01)
- *H01L 41/08* (2006.01)
- *H01L 41/09* (2006.01)

(52) U.S. Cl.
CPC .......... *H02N 1/006* (2013.01); *H01L 41/081* (2013.01); *H01L 41/0973* (2013.01)

(58) Field of Classification Search
CPC .... H02N 1/006; H01L 41/081; H01L 41/0973
See application file for complete search history.

(56) References Cited

U.S. PATENT DOCUMENTS

| | | | |
|---|---|---|---|
| 4,515,997 A | 5/1985 | Stinger, Jr. | |
| 5,689,570 A | 11/1997 | Taylor | |
| 5,699,130 A | 12/1997 | Taylor | |
| 6,403,995 B2 | 6/2002 | Thomas | |
| 7,089,069 B2 | 8/2006 | Gabriel et al. | |
| 8,780,673 B2 | 7/2014 | Cohen et al. | |
| 8,983,097 B2 | 3/2015 | Dehe et al. | |
| 9,002,037 B2 | 4/2015 | Dehe et al. | |
| 9,024,396 B2 | 5/2015 | Dehe | |
| 2001/0048123 A1 | 12/2001 | Thomas | |
| 2003/0044029 A1 | 3/2003 | Gabriel et al. | |
| 2008/0104825 A1* | 5/2008 | Dehe | H04R 19/005 29/594 |
| 2009/0182524 A1* | 7/2009 | Stephanson | G06K 9/00771 702/127 |
| 2011/0115337 A1* | 5/2011 | Nakamura | G10K 9/122 310/334 |
| 2011/0233693 A1* | 9/2011 | Perruchot | B81B 3/0072 257/417 |

(Continued)

FOREIGN PATENT DOCUMENTS

| | | |
|---|---|---|
| EP | 2033480 B1 | 7/2012 |
| WO | 2009066290 A2 | 5/2009 |
| WO | 2016166763 A2 | 10/2016 |

*Primary Examiner* — Bryan P Gordon

(74) *Attorney, Agent, or Firm* — Slater Matsil, LLP

(57) ABSTRACT

According to an embodiment, a microelectromechanical systems MEMS transducer includes a deflectable membrane attached to a support structure, an acoustic valve structure configured to cause the deflectable membrane to be acoustically transparent in a first mode and acoustically visible in a second mode, and an actuating mechanism coupled to the deflectable membrane. Other embodiments include corresponding systems and apparatus, each configured to perform various embodiment methods.

20 Claims, 13 Drawing Sheets

(56) References Cited

U.S. PATENT DOCUMENTS

| | | | |
|---|---|---|---|
| 2012/0086367 A1* | 4/2012 | Iyad Al Dibs | H02N 1/006 |
| | | | 318/116 |
| 2013/0223023 A1* | 8/2013 | Dehe | B81B 7/0029 |
| | | | 361/752 |
| 2015/0014796 A1 | 1/2015 | Dehe | |
| 2015/0130325 A1* | 5/2015 | Suenaga | H01L 41/047 |
| | | | 310/334 |
| 2015/0198431 A1* | 7/2015 | Uchida | G01B 9/02091 |
| | | | 356/479 |

\* cited by examiner

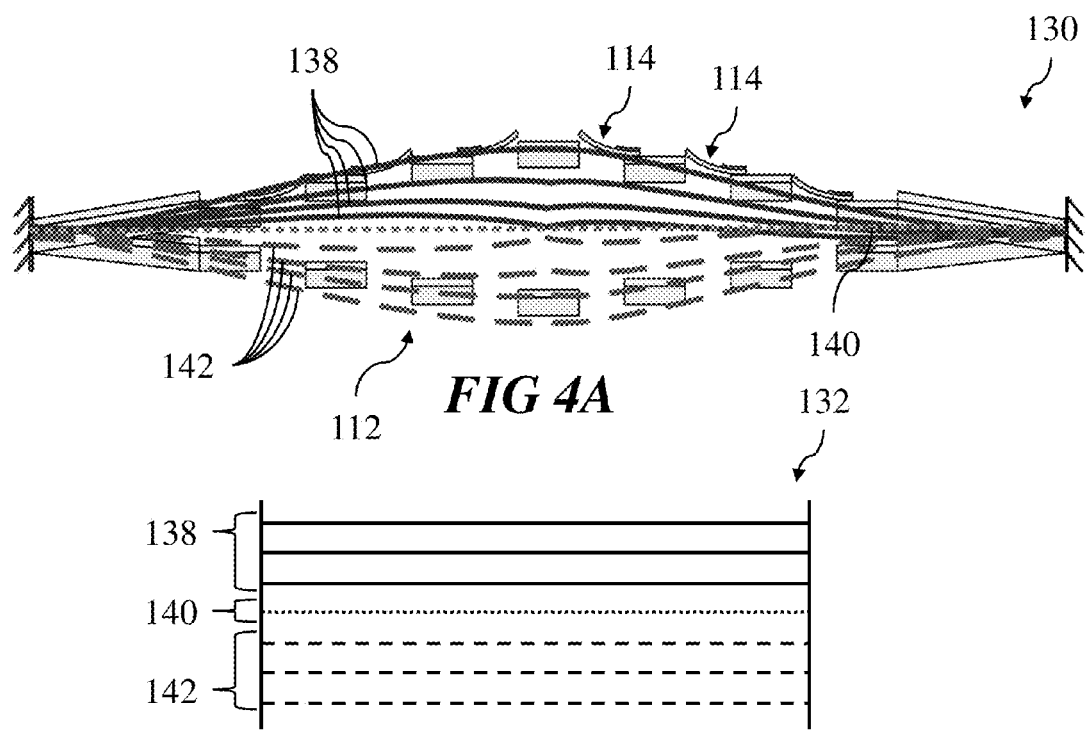
*FIG 4A*
*FIG 4B*
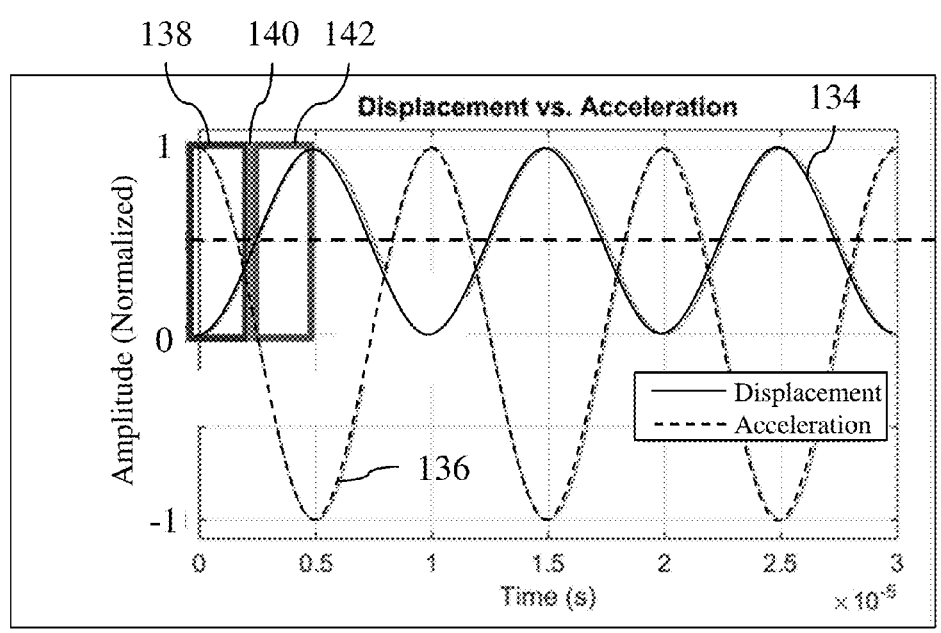
*FIG 4C*

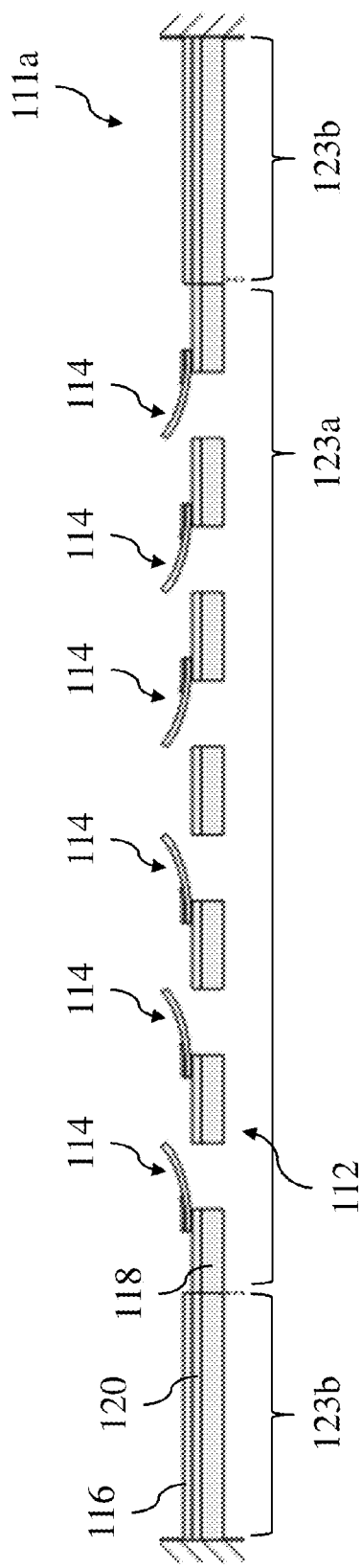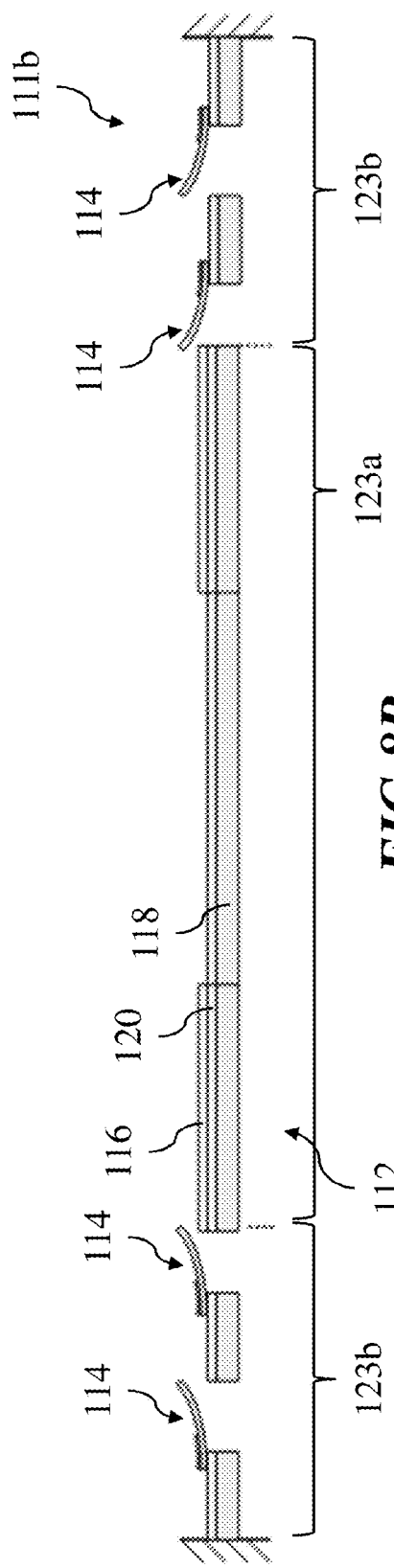

_US 10,367,430 B2_

SYSTEM AND METHOD FOR A VARIABLE FLOW TRANSDUCER

TECHNICAL FIELD

The present invention relates generally to transducers, and, in particular embodiments, to a system and method for a variable flow transducer.

BACKGROUND

Transducers convert signals from one domain to another and are often used as sensors. For example, acoustic transducers convert between acoustic signals and electrical signals. A microphone is one type of acoustic transducer that converts sound waves, i.e., acoustic signals, into electrical signals, and a speaker is one type of acoustic transducer that converts electrical signals into sound waves.

Microelectromechanical system (MEMS) based transducers include a family of transducers produced using micromachining techniques. Some MEMS transducers, such as a MEMS microphone, gather information from the environment by measuring the change of physical state in the transducer and transferring the signal to be processed by the electronics which are connected to the MEMS sensor. Other MEMS transducers, such as a MEMS microspeaker, convert electrical signals into a change in the physical state in the transducer. MEMS devices may be manufactured using micromachining fabrication techniques similar to those used for integrated circuits.

MEMS devices may be designed to function as oscillators, resonators, accelerometers, gyroscopes, pressure sensors, microphones, micro-mirrors, microspeakers, etc. Many MEMS devices use capacitive sensing or actuation techniques for transducing the physical phenomenon into electrical signals and vice versa. In such applications, the capacitance change in the transducer is converted to a voltage signal using interface circuits or a voltage signal is applied to the capacitive structure in the transducer in order to generate a force between elements of the capacitive structure.

For example, a capacitive MEMS microphone includes a backplate electrode and a membrane arranged in parallel with the backplate electrode. The backplate electrode and the membrane form a parallel plate capacitor. The backplate electrode and the membrane are supported by a support structure arranged on a substrate.

The capacitive MEMS microphone is able to transduce sound pressure waves, for example speech, at the membrane arranged in parallel with the backplate electrode. The backplate electrode is perforated such that sound pressure waves pass through the backplate while causing the membrane to vibrate due to a pressure difference formed across the foreside and backside of the membrane. Hence, the air gap between the membrane and the backplate electrode varies with vibrations of the membrane. The variation of the membrane in relation to the backplate electrode causes variation in the capacitance between the membrane and the backplate electrode. This variation in the capacitance is transformed into an output signal responsive to the movement of the membrane and forms a transduced signal.

Using a similar structure, a voltage signal may be applied between the membrane and the backplate in order to cause the membrane to vibrate and generate pressure pulses, such as sound pressure waves. Thus, a capacitive plate MEMS structure may operate as a microspeaker.

SUMMARY

According to an embodiment, a microelectromechanical systems MEMS transducer includes a deflectable membrane attached to a support structure, an acoustic valve structure configured to cause the deflectable membrane to be acoustically transparent in a first mode and acoustically visible in a second mode, and an actuating mechanism coupled to the deflectable membrane. Other embodiments include corresponding systems and apparatus, each configured to perform various embodiment methods.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A, 4B, and 4C illustrate an embodiment model variable flow transducer and a corresponding waveform diagram;

FIGS. 8A and 8B illustrate side view cross-sections of more embodiment variable flow transducers;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
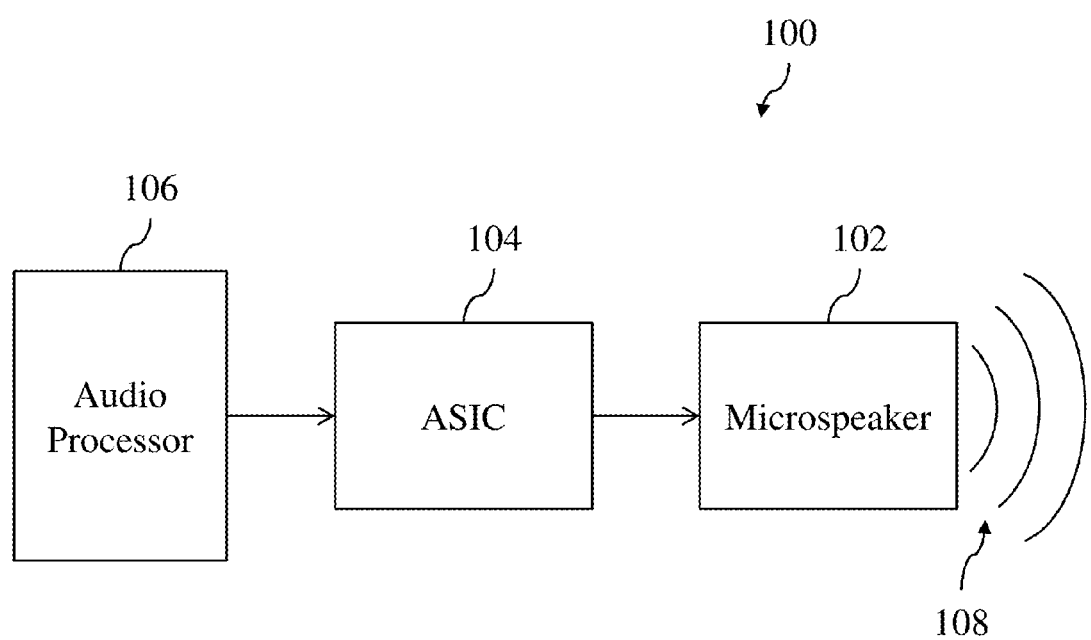
FIG. 1 illustrates a system block diagram of an embodiment variable flow transducer.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely acoustic transducers, and more particularly, MEMS microspeakers. Some of the various embodiments described herein include MEMS microspeakers, acoustic transducer systems, variable volume flow transducers, and variable volume flow MEMS microspeakers. In other embodiments, aspects may also be applied to other applications involving any type of transducer domain according to any fashion as known in the art.

Speakers are transducers that transduce electrical signals into acoustic signals. The acoustic signal is produced by the speaker structure generating pressure oscillations at a frequency. For example, the audible range of humans is about 20 Hz to 20 kHz, with some humans able to hear less than this range and some humans able to hear beyond this range. Thus, a speaker operating in order to produce audible acoustic signals transduces electrical signals into sound pressure oscillations with frequencies between 20 Hz and 20 kHz. A constant frequency signal is conveyed as a simple tone, similar to a note on a piano. Speech and other typical sounds such as, e.g., music, are composed of numerous acoustic signals with numerous frequencies at the same time.

Microspeakers operate according to the same principles as speakers, but are produced using micromachining or microfabrication techniques. Thus, audible microspeakers include small structures that are excited by electrical signals in order to generate pressure oscillations in the audible frequency range.

According to various embodiments, a speaker, or microspeaker, is configured to generate audible acoustic signals by oscillating at frequencies above the audible frequency range. In such embodiments, the speaker is configured to generate pressure oscillations at a frequency above the audible range and modify the volume flow of the pressure oscillations according to a lower frequency in the audible frequency range. In such embodiments, the human auditory system will recognize the envelope of the pressure oscillations and act like a low pass filer. In additional embodiments, the speaker may be configured to generate pressure oscillations at a frequency above the audible range and modify the volume flow of the pressure oscillations according to a lower frequency still outside the audible frequency range in order to operate as an ultrasound transducer.

In various embodiments, the speaker is referred to as a variable flow transducer. The frequency of the variable flow transducer may maintain operation outside the audible frequency range, while the volume flow alters the positive and negative sound pressures of the oscillations according to other frequencies that are inside the audible frequency range. In such embodiments, the variable flow transducer may include a deflectable membrane with multiple valve structures that are configured to adjust the acoustic impedance and alter the volume flow as the deflectable membrane oscillates above the audible frequency range. Various embodiments are further described herein below.

FIG. 1 illustrates a system block diagram of an embodiment variable flow transducer 100 including microspeaker 102, application specific integrated circuit (ASIC) 104, and audio processor 106. According to various embodiments, microspeaker 102 generates acoustic signal 108, which includes pressure oscillations at a frequency above the audible limit, e.g., 20 kHz, with adjustments of the positive and negative sound pressures during the oscillations. The positive and negative sound pressures may be adjusted by using embodiment valves to adjust the acoustic impedance of a membrane in microspeaker 102. By adjusting the volume flow through control of the positive and negative sound pressures, low frequency sound pressure signals in the audible range may be generated from the membrane that oscillates at a frequency above the audible limit. Thus, microspeaker 102 generates acoustic signal 108 including an audible acoustic signal formed from an inaudible acoustic signal. In various embodiments, the pressure oscillations of acoustic signal 108 have a frequency that is at least twice the limit of the human auditory range, e.g., 40 kHz, in order to fulfill the Nyquist-Shannon sampling theorem.

In various embodiments, microspeaker 102 includes a deflectable membrane with valves. Various example embodiment structures are described further herein below. Microspeaker 102 is driven by drive signals provided from ASIC 104. ASIC 104 may generate analog drive signals based on a digital input control signal. In some embodiments, ASIC 104 and microspeaker 102 are attached to a same circuit board. In other embodiments, ASIC 104 and microspeaker 102 are formed on a same semiconductor die. ASIC 104 may include biasing and supply circuits, an analog drive circuit, and a digital to analog converter (DAC). In further embodiments, microspeaker 102 may include a microphone, for example, and ASIC 104 may also include readout electronics such as an amplifier or analog to digital converter (ADC).

In some embodiments, the DAC in ASIC 104 receives a digital control signal at an input supplied by audio processor 106. The digital control signal is a digital representation of the acoustic signal that microspeaker 102 produces. In various embodiments, audio processor 106 may be a dedicated audio processor, a general system processor, such as a central processing unit (CPU), a microprocessor, or a field programmable gate array (FPGA). In alternative embodiments, audio processor 106 may be formed of discrete logic blocks or other components. In various embodiments, audio processor 106 generates the digital representation of acoustic signal 108 and provides the digital representation of acoustic signal 108. In other embodiments, audio processor 106 provides the digital representation of only the audible portion of acoustic signal 108 and ASIC 104 generates the driving signal for acoustic signal 108 with the higher inaudible frequency oscillations and the audible frequency oscillations based on variations in volume flow.

According to various additional embodiments, microspeaker 102 may also generate acoustic signal 108, which includes pressure oscillations at a frequency above the audible limit, e.g., 20 kHz, with volume flow adjustments of the sound pressure oscillations that are adjusted at frequencies that are also above the audible range. For example, microspeaker 102 may operate as an ultrasound transducer for ultrasound imaging or for ultrasound near field detection. In such embodiments, microspeaker 102 operates with a higher frequency as a carrier signal that has positive and negative sound pressures adjusted according to a lower frequency of the generated target signal, such as an ultrasound signal for example.

Figure 2A:
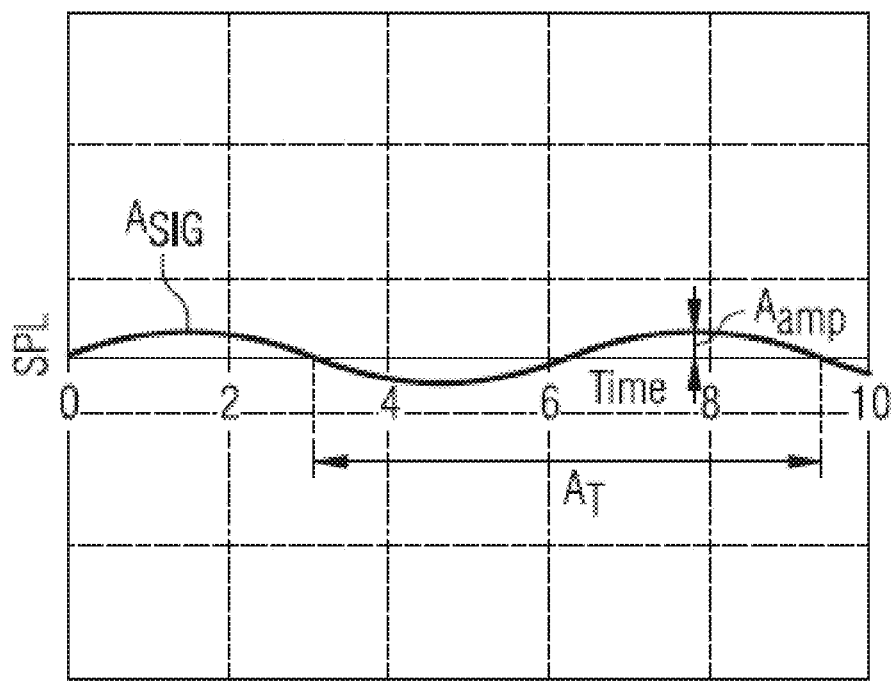
FIGS. 2A and 2B illustrate waveform diagrams of illustrative acoustic signals.
Figure 2B:
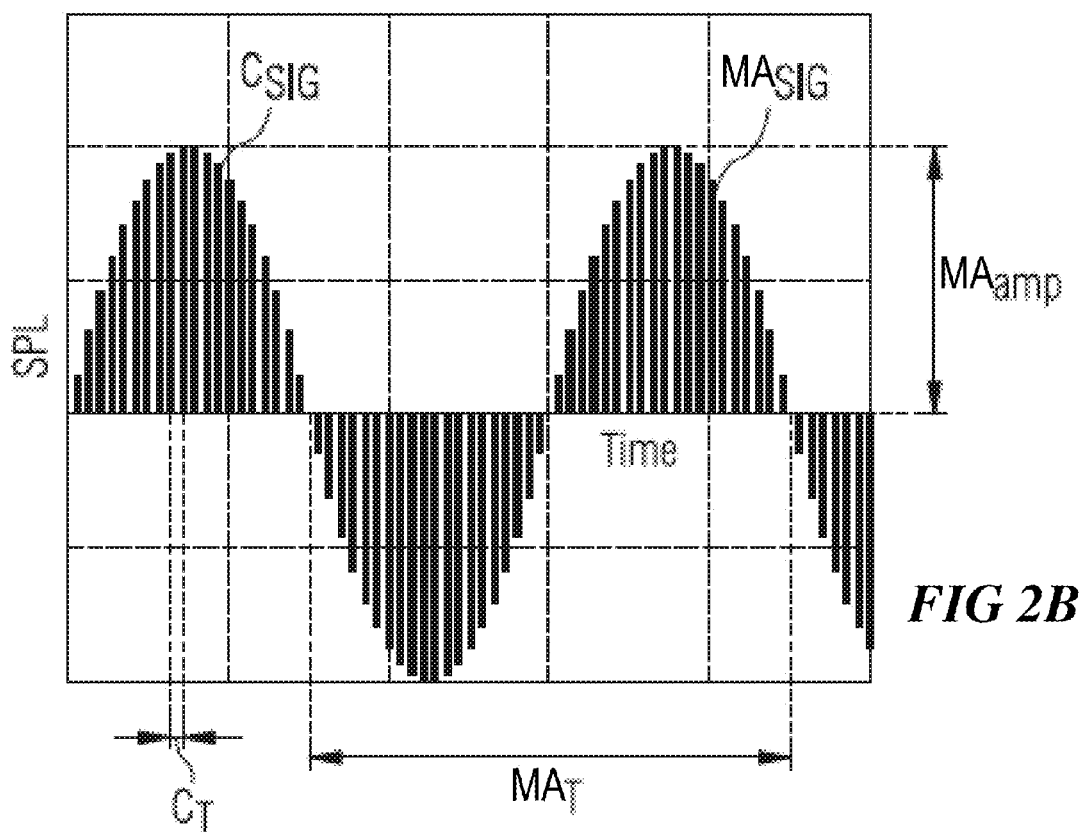

FIGS. 2a and 2b illustrate waveform diagrams of illustrative acoustic signals. FIG. 2a shows acoustic signal $A_{SIG}$ that may be produced by a speaker, for example. Acoustic signal $A_{SIG}$ has amplitude $A_{amp}$ and frequency $A_{freq}$, i.e., period $A_T=1 \div A_{freq}$. Acoustic signal $A_{SIG}$ may illustrate a sound wave produced by a speaker. During operation, the sound wave has frequency $A_{freq}$ that is within the audible frequency range for a human, e.g., between about 20 Hz and 20 kHz. FIG. 2a illustrates amplitude $A_{amp}$ for acoustic signal $A_{SIG}$ at an unspecified level. For a MEMS microspeaker, generating a large sound pressure level (SPL) may present challenges due to the small size of the membrane, especially at low frequency. For example, a MEMS microspeaker may include a decrease of 40 dB in SPL per decade as frequency decreases through the audible frequency range.

Thus, it may be challenging to generate higher SPLs at frequencies below, for example, 1-10 kHz without increasing the size of the pumping structure, for example.

FIG. 2b shows modulated acoustic signal $MA_{SIG}$ that may be produced by an embodiment variable flow transducer, such as a MEMS microspeaker. According to various embodiments, modulated acoustic signal $MA_{SIG}$ has amplitude $MA_{amp}$ and frequency $MA_{freq}$, i.e., period $MA_T=1\div MA_{freq}$, and is formed of carrier signal $C_{SIG}$, which has variable amplitude $C_{amp}$ and frequency $C_{freq}$, i.e., period $C_T=1\div C_{freq}$. As shown, frequency $C_{freq}$ is much higher than frequency $MA_{freq}$. Specifically, frequency $C_{freq}$ is above the audible frequency range of a human, i.e., above 20 kHz, and frequency $MA_{freq}$ is within the audible frequency range of a human, i.e., between about 20 Hz and 20 kHz. In such embodiments, amplitude $C_{amp}$ is adjusted in order to form the rising and falling wave form of pumping acoustic signal $PA_{SIG}$. Further, negative or positive sound pressures are removed or reduced for carrier signal $C_{SIG}$ in order to form the rising and falling wave form of modulated acoustic signal $MA_{SIG}$. The oscillations of a deflectable membrane generally include symmetric volume flow that includes equal positive and negative pressure. In various embodiments, carrier signal $C_{SIG}$ includes only one type of sound pressure, e.g., positive sound pressure, for the first half-wave ($MA_T/2$) of modulated acoustic signal $MA_{SIG}$ and only a second type of sound pressure, e.g., negative sound pressure, for the second hale-wave ($MA_T/2$) of modulated acoustic signal $MA_{SIG}$. In such embodiments, carrier signal $C_{SIG}$ shapes the positive sound pressure first half-wave of modulated acoustic signal $MA_{SIG}$ by removing (or reducing) the negative sound pressure components and the negative sound pressure second half-wave of modulated acoustic signal $MA_{SIG}$ by removing (or reducing) the positive sound pressure components. The variation of amplitude $C_{amp}$ and direction of carrier signal $C_{SIG}$, through the reducing or removing of positive or negative sound pressures, is performed at a specific frequency in order to form modulated acoustic signal $MA_{SIG}$ with frequency $MA_{freq}$, which is in the audible range, e.g., 20 Hz to 20 kHz. According to various embodiments, variable flow transducers adjust the acoustic impedance of a deflectable membrane in order to reduce or remove negative or positive sound pressures.

In particular embodiments, amplitude $MA_{amp}$ of modulated acoustic signal $MA_{SIG}$ may be larger than a traditional microspeaker that oscillates at an audible frequency. In specific embodiments, the oscillation of the pumping speaker remains at a higher frequency such that the SPL of modulated acoustic signal $MA_{SIG}$ does not decrease much or at all when frequency $MA_{freq}$ is below about 1-10 kHz and above about 10 Hz, for example. According to various embodiments, the produced sound or pressure pulses of modulated acoustic signal $MA_{SIG}$ are equal to, or approximately equal to, the second derivative of the deflectable membrane position, which is the acceleration of the deflectable membrane. Thus, in various embodiments, the control of the pumping action, such as the control of the positive and negative sound pressures, may be based on the acceleration of the deflectable membrane.

In various embodiments, frequency $C_{freq}$ may be held constant as amplitude $C_{amp}$ and direction of carrier signal $C_{SIG}$ are varied. In specific embodiments, frequency $C_{freq}$ may be matched to the resonant frequency of the speaker or microspeaker in order to produce greater oscillations of the deflectable membrane. In other embodiments, frequency $C_{freq}$ may be variable. In particular examples, frequency $C_{freq}$ is between 40 kHz and 10 MHz. In more specific embodiments, frequency $C_{freq}$ is between 100 kHz and 300 kHz. In such various embodiments, frequency $MA_{freq}$ is below 20 kHz. Specifically, frequency $MA_{freq}$ is in the audible frequency range of humans, i.e., between 20 Hz and 20 kHz, where this range may be expanded for some humans and narrowed for others. In alternative embodiments, frequency $MA_{freq}$ may be above 20 kHz. In such embodiments, modulated acoustic signal $MA_{SIG}$ may be, instead of an acoustic signal, an ultrasound signal used in an ultrasound transducer for ultrasound imaging or near field detection.

According to various embodiments, variable flow transducers, such as MEMS microspeakers, are operated as described in reference to FIG. 2b by using a carrier signal above the audible frequency range to form a modulated acoustic signal within the audible frequency range. Various embodiment variable flow transducers are described herein below in order to illustrate some of the specific applications including capacitive plate structures and other pumping structures. Such embodiment variable volume flow transducers adjust the acoustic impedance of the deflectable membrane in order to reduce or remove negative or positive sound pressures.

Referring back to FIG. 1 in view of FIGS. 2a and 2b, ASIC 104 in variable flow transducer 100 is configured to determine the resonant frequency of microspeaker 102 in some embodiments. In such embodiments, ASIC 104 may excite microspeaker 102 at a plurality of frequencies and measure the response for each frequency. Based on the measured response, ASIC 104 determines the resonant frequency of microspeaker 102. In such embodiments, ASIC 104 may set frequency $C_{freq}$ for carrier signal $C_{SIG}$ to the determined resonant frequency. In other alternative embodiments, ASIC 104 may control elements of microspeaker 102 in order to adjust the resonant frequency to match frequency $C_{freq}$ for carrier signal $C_{SIG}$. In one embodiment, controlling the elements includes adjusting mechanical components of microspeaker 102. In an alternative embodiment, controlling the elements includes adjusting active or passive electrical components of microspeaker 102.

Figure 3A:
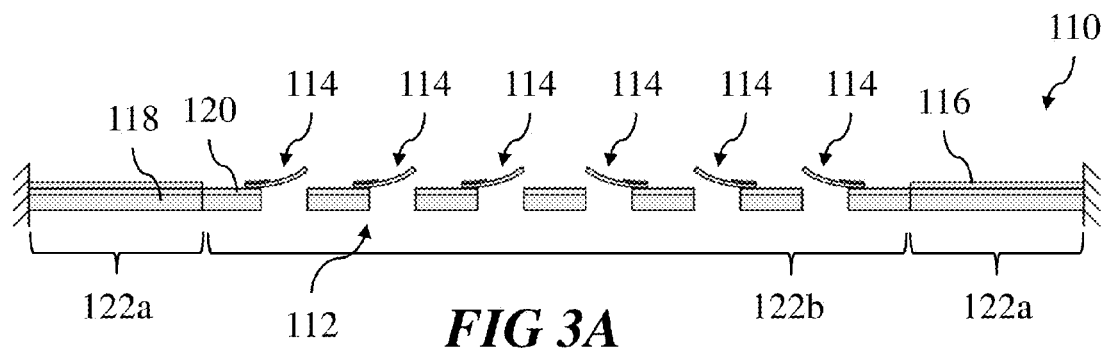
FIGS. 3A, 3B, and 3C illustrate side view cross-sections of an embodiment variable flow transducer.
Figure 3B:
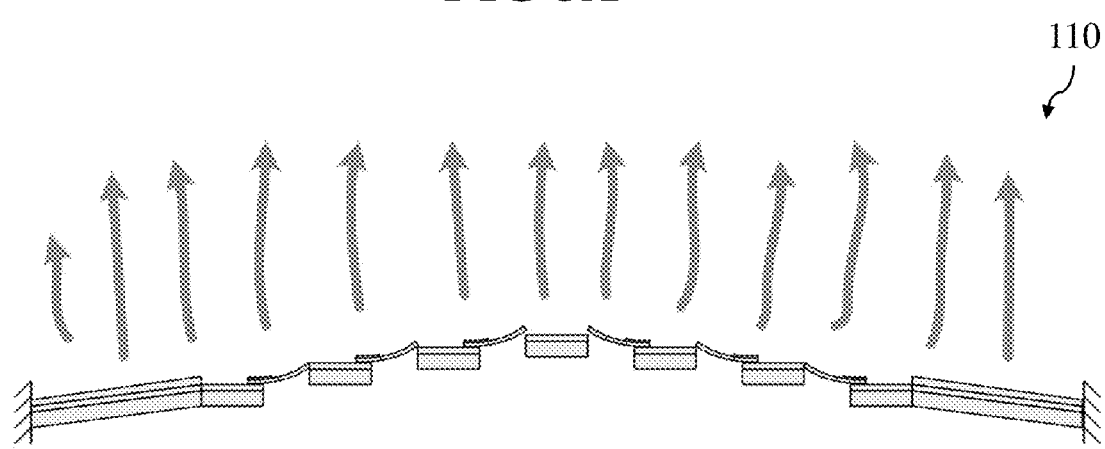
Figure 3C:
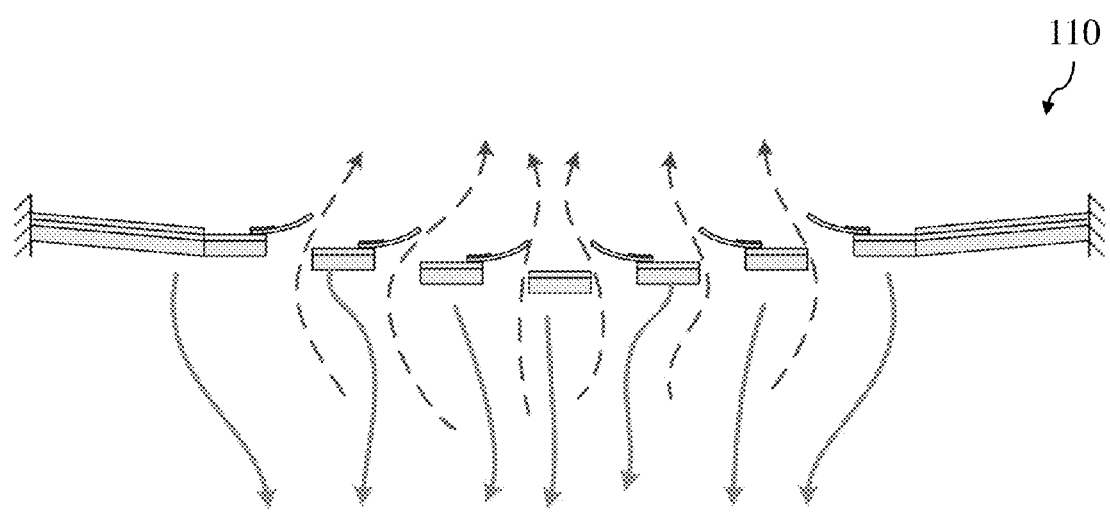

FIGS. 3A, 3B, and 3C illustrate side view cross-sections of an embodiment variable flow transducer 110. According to various embodiments, variable flow transducer 110 adjusts the acoustic impedance during oscillations in order to regulate the generation of positive and negative sound pressures. In various embodiments, variable flow transducer 110 includes membrane 112, acoustic valves 114, and actuating structures 116. In such embodiments, actuating structures 116 may include a piezoelectric layer or layers configured to generate a force on membrane 112 based on an applied voltage. Actuating structures 116 are formed on a surface of membrane 112 in actuation area 122a. Actuating structures 116 may be formed on the top surface of membrane 112 in some embodiments, as illustrated, or may be formed on the bottom surface of membrane 112 in other embodiments. In further embodiments, actuating structures 116 may be formed on the top and bottom surfaces of membrane 112. In such embodiments, the driving force is inverse between top and bottom actuating structures 116.

In various embodiments, an electrical drive signal, such as a control voltage, is provided to actuating structures 116 in order to excite membrane 112 to oscillate at a first frequency above the audible range, i.e., above 20 kHz. For example, in some embodiments, membrane 112 is excited to oscillate at a resonant frequency, which may range from 75 kHz to 200 kHz. In such embodiments, the first frequency may correspond to frequency $C_{freq}$ for carrier signal $C_{SIG}$, as described hereinabove in reference to FIG. 2B. Thus, membrane 112 oscillates with upward and downward movements as shown in FIGS. 3B and 3C. In various embodiments, acoustic valves 114 are closed for movement in a first direction, such as displayed in FIG. 3B during a positive acceleration, and open during the negative acceleration as it occurs during braking of the membrane. FIG. 3C shows the second direction, where positive acceleration occurs in this direction and negative acceleration occurs in the inverse direction.

In various embodiments, membrane 112 has a first acoustic impedance when acoustic valves 114 are closed and a second acoustic impedance when acoustic valves 114 are open. The first impedance is much greater than the second impedance. In such embodiments, when the acoustic impedance is higher, i.e., when acoustic valves 114 are closed, the sound pressure generated by oscillations of membrane 112 are at a normal or large level. Conversely, when the acoustic impedance is lower, i.e., when acoustic valves 114 are open, the sound pressure generated by oscillations of membrane 112 are at a lower or reduced level. Thus, in various embodiments, variable flow transducer 110 is configured to adjust the acoustic impedance of membrane 112 by opening and closing acoustic valves 114 and generate normal or large sound pressure levels in a positive acceleration and lower or reduced sound pressure levels in a negative acceleration.

In various embodiments, the acoustic impedance of membrane 112 may be adjusted to be acoustically transparent for a certain percentage of the membrane area when acoustic valves 114 are open. For example, in some embodiments, the quality and the area of acoustic valves 114 cause membrane 112 to be 90% acoustically transparent in a particular embodiment. In another particular embodiment, the quality and the area of acoustic valves 114 cause membrane 112 to be 50% acoustically transparent. In other embodiments, the acoustic transparency of membrane 112 may range from 30% to 95%.

As described hereinabove in reference to FIG. 2B, by adjusting the acoustic impedance of membrane 112 to be large during positive acceleration in upward movements and reduced during braking or negative acceleration for upward movements (as shown in FIGS. 3B), variable flow transducer 110 may remove or reduce negative or positive sound pressures and form a first half-wave of an acoustic signal having a second frequency that is within the audible range. In such embodiments, the second frequency may correspond to frequency $MA_{freq}$ for modulated acoustic signal $MA_{SIG}$, as described hereinabove in reference to FIG. 2B. Similarly, by adjusting the acoustic impedance of membrane 112 to be large during downward movements for positive accelerations and reduced during downward movements for negative acceleration (as shown in FIG. 3C), variable flow transducer 110 may remove or reduce negative sound pressures and form a second half-wave of the acoustic signal. Thus, by modulating the acoustic impedance to control the generate sound pressures, membrane 112 may oscillate at the first frequency, that is outside the audible range, and generate an acoustic signal at the second frequency, that is within the audible range. In such various embodiments, similar efforts or techniques referred to as digital sound reconstruction may be implemented.

In various embodiments, acoustic valves 114 include piezoelectric materials that open and close acoustic valves 114 based on electrical control signals. Acoustic valves 114 are formed throughout ventilation area 122b of membrane 112. In various embodiments, membrane 112 is formed of structural layer 118 and isolation layer 120. In some embodiments, structural layer 118 is a conductive layer, such as a semiconductor or metal, and isolation layer 120 is an electrically insulating layer, such as an oxide layer, a nitride layer, or an oxynitride layer. In other embodiments, structural layer 118 and isolation layer 120 may be combined into a single conductive or electrically insulating layer. As shown, membrane 112 may be anchored to a support structure at a periphery. Further structure details of various embodiments are described hereinafter in reference to the other Figures. In other embodiments, acoustic valves 114 or membrane 112 may be actuated electrostatically, instead of piezoelectrically as shown.

FIGS. 4A, 4B, and 4C illustrate an embodiment model variable flow transducer and a corresponding waveform diagram. Specifically, FIG. 4A depicts annotated variable flow transducer 130, FIG. 4B depicts piston model 132, and FIG. 4C depicts membrane displacement waveform 134 and membrane acceleration waveform 136. According to various embodiments, when acoustic valves 114 are closed, membrane 112 has a high acoustic impedance, as illustrated by closed valve portion 138 of annotated variable flow transducer 130 and piston model 132. Conversely, when acoustic valves 114 are open, membrane 112 has a low acoustic impedance, as illustrated by open valve portion 142 of annotated variable flow transducer 130 and piston model 132. Transition between acoustic high impedance and acoustic low impedance is depicted by transition portion 140. In such embodiments, oscillations of membrane 112 may be modeled with equal displacement of the entire membrane according to piston model 132. When membrane 112 has a low acoustic impedance, the acoustic medium, such as air, is able to easily pass from one side of membrane 112 to the other. When membrane 112 has a high acoustic impedance, the acoustic medium, such as air, is unable to easily pass from one side of membrane 112 to the other.

According to various embodiments, transitioning from closed valve portion 138 to open valve portion 142 may be based on the acceleration of membrane 112. As illustrated by membrane displacement waveform 134 and membrane acceleration waveform 136, when acceleration of membrane 112 has a positive value, acoustic valves 114 are closed, and when acceleration of membrane 112 has a negative value, acoustic valves 114 are open. In such embodiments, the positive and negative sign of the acceleration may be switched based on the half-wave of the acoustic signal, positive or negative half-wave (see FIG. 2B), being generated. In various embodiments, the acoustic impedance may be adjusted based on the displacement or acceleration of membrane 112 in order to selectively generate positive or negative sound pressure waves for forming audible acoustic signals.

Further embodiment variable flow transducers are described hereinafter as illustrative embodiments.

Figure 5A:
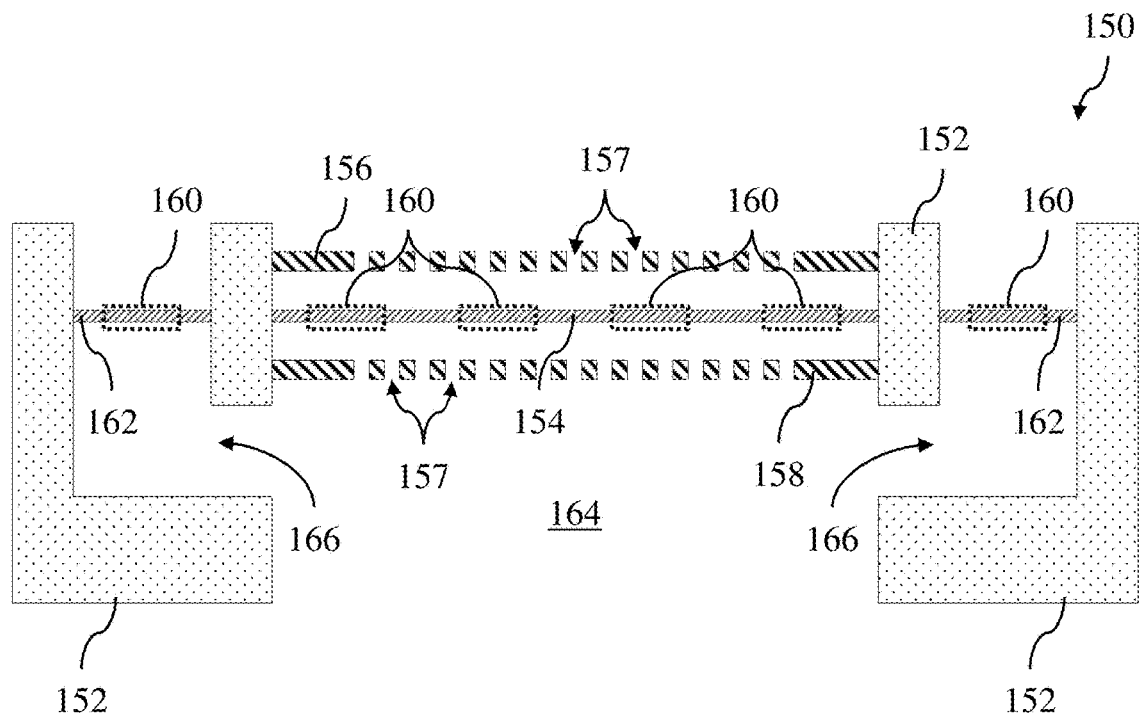
FIGS. 5A and 5B illustrate side view cross-sections of additional embodiment variable flow transducer.
Figure 5B:
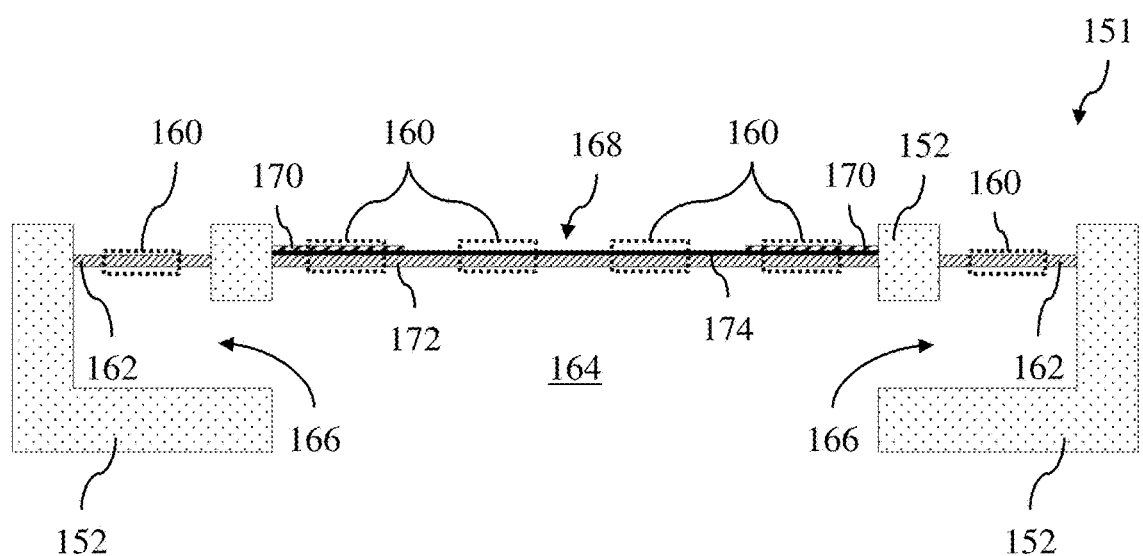

FIGS. 5A and 5B illustrate side view cross-sections of additional embodiment variable flow transducer 150 and embodiment variable flow transducer 151. According to various embodiments, variable flow transducer 150 includes substrate 152, membrane 154, top backplate 156 or bottom backplate 158, and acoustic valves 160. Acoustic valves 160 are shown generically as dashed structures and may be implemented as piezoelectric or electrostatic controllable valves. Example embodiment acoustic valves are described further hereinafter in reference to FIGS. 6A, 6B, and 6C.

In various embodiments, membrane 154 is a deflectable membrane that is actuated electrostatically by applying a voltage difference between membrane 154 and top backplate 156 or between membrane 154 and bottom backplate 158. In some embodiments, variable flow transducer 150 is a dual backplate microspeaker that includes both top backplate 156 and bottom backplate 158. In other embodiments, variable flow transducer 150 is a single backplate microspeaker that includes either top backplate 156 or bottom backplate 158. In various embodiments, top backplate 156 and bottom backplate 158 include perforations 157 that allow fluidic transport from one side of top backplate 156 or bottom backplate 158 to the other side. In such embodiments, the fluidic transport allows acoustic signals to pass through top backplate 156 and bottom backplate 158, which provide a low acoustic impedance.

In various embodiments, membrane 154 is electrostatically driven to oscillate at a frequency above the audible range. In specific embodiments, membrane 154 oscillates with a frequency ranging from 40 kHz to 300 kHz. During oscillations, acoustic valves 160 are controlled to regulate generation of positive or negative sound pressures from oscillations of membrane 154 and form modulated acoustic signals that have frequencies within the audible range, as described hereinabove in reference to FIGS. 2A, 2B, 3A, 3B, 3C, 4A, 4B, and 4C.

In some embodiments, bypass route 166, bypass structure 162, and acoustic valves 160 in bypass structure 162 are included surrounding membrane 154. In other embodiments, bypass route 166, bypass structure 162, and acoustic valves 160 in bypass structure 162 are omitted. In some embodiments including bypass route 166, acoustic valves 160 on membrane 154 may be omitted. In other embodiments including bypass route 166, acoustic valves 160 on membrane 154 are included.

In various embodiments, substrate 152 is formed of a semiconductor material. For example, substrate 152 may be silicon, such as polysilicon, gallium-arsenide (GaAs), indium phosphide (InP), or carbon in particular embodiments. In other embodiments, substrate 152 is formed of a dielectric material such as a glass. In still further embodiments, substrate is formed of a polymer, such as hexamethyldisilazane (HMDS) for example. In other alternative embodiments, substrate 152 is formed of a ceramic material. In various embodiments, membrane 154 is formed of a semiconductor or a metal, such as polysilicon, gold, aluminum, copper, or platinum. In other embodiments, membrane 154 formed of a non-conductive layer and a conductive layer. In various embodiments, top backplate 156 and bottom backplate 158 are formed of a semiconductor or a metal, such as polysilicon, gold, aluminum, copper, or platinum. In further embodiments, top backplate 156 and bottom backplate 158 are formed of multiple layers including conductive layers and non-conductive or electrically insulating layer. For example, in a particular embodiment, top backplate 156 and bottom backplate 158 are formed of polysilicon and silicon nitride. Substrate 152 includes cavity 164, which may pass through the entirety of substrate 152, such as through a wafer including substrate 152.

According to various embodiments, variable flow transducer 151 includes substrate 152, membrane 168, and acoustic valves 160. In such embodiments, membrane 168 is a deflectable membrane that is actuated piezoelectrically by applying a voltage signal to piezoelectric layer 170. By applying a voltage signal to piezoelectric layer 170, a deformation is generated in piezoelectric layer 170 that generates a force on membrane 168. The excitation of membrane 168 is performed at a higher frequency above the audible range and acoustic valves 160 are controlled to form modulated acoustic signals that have frequencies within the audible range, as described hereinabove in reference to variable flow transducer 150 in FIG. 5A.

In various embodiments, membrane 168 includes structural layer 172, isolation layer 174, and piezoelectric layer 170. In some embodiments, structural layer 172 is a conductive layer, such as a semiconductor layer or a metal layer. Isolation layer 174 may be an electrically insulating layer, such as an oxide layer, a nitride layer, or an oxynitride layer. In various embodiments, piezoelectric layer 170 includes piezoelectric ceramics or piezoelectric crystals. In particular embodiments, piezoelectric layer 170 includes lead zirconate titanate (PZT) or barium titanate ($BaTiO_3$). In other particular embodiments, piezoelectric layer 170 includes zinc oxide (ZnO), aluminum nitride (AlN), or polyvinylidene fluoride (PVDF).

According to various embodiments, variable flow transducer 150 and variable flow transducer 151 are illustrated in FIGS. 5A and 5B in cross-section and may include any membrane shape when viewed from above. Specifically, membrane 154 and membrane 168 may be round, including circular or oval shapes, or rectangular in particular embodiments. In some embodiments, bypass route 166 is omitted and substrate 152 extends to and surrounds membrane 154 or membrane 168. In other embodiments, bypass route 166 is included and substrate 152 includes a portion surrounding and supporting membrane 154 or membrane 168 that is connected to the main portion of substrate 152. In such embodiments, portions of the perimeter of membrane 154 or membrane 168 include bypass route 166 and other portions of the perimeter of membrane 154 or membrane 168 include solid portions of substrate 152. Various embodiment variable flow transducers are described hereinafter in reference to top views illustrated in FIGS. 7A, 7B, 7C, and 7D.

Figure 6A:
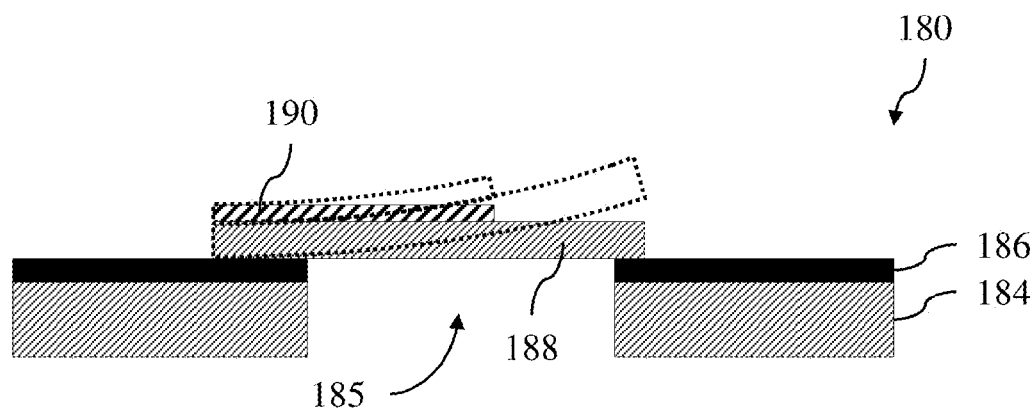
FIGS. 6A, 6B, and 6C illustrate side view cross-sections of embodiment acoustic valves.
Figure 6B:
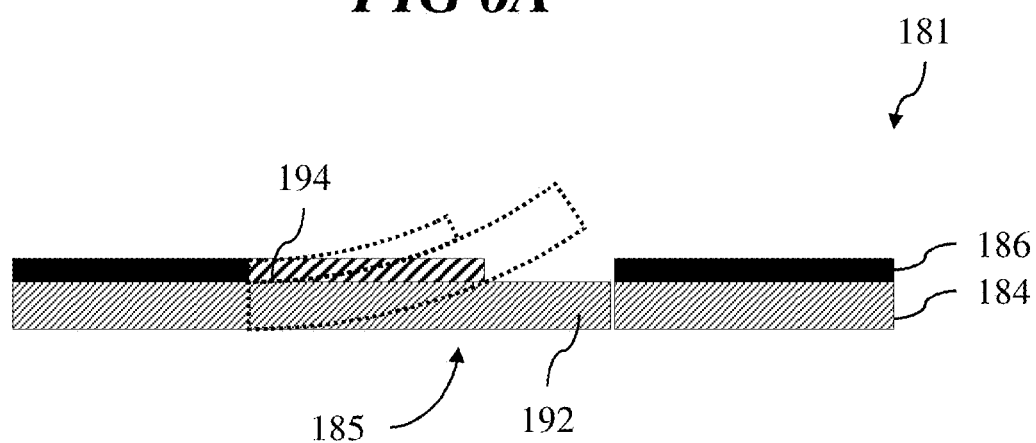
Figure 6C:
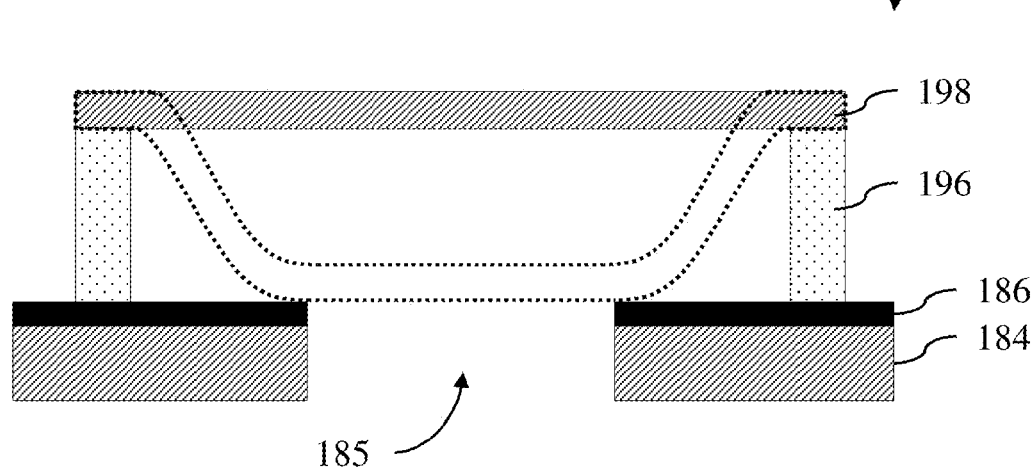

FIGS. 6A, 6B, and 6C illustrate side view cross-sections of embodiment acoustic valves 180, 181, and 182. According to various embodiments, acoustic valve 180, acoustic valve 181, or acoustic valve 182 may be used to implement any of the acoustic valves described herein, such as acoustic valve 114 or acoustic valve 160 as described hereinabove.

According to various embodiments, acoustic valve 180 includes structural layer 184, isolation layer 186, acoustic flap 188, and piezoelectric layer 190. In various embodiments, piezoelectric layer 190 may include any of the materials described hereinabove in reference to piezoelectric layer 170. Piezoelectric layer 190 is disposed on acoustic flap 188. In various embodiments, acoustic flap 188 has mechanical elasticity. In particular embodiments, acoustic flap 188 is single crystal silicon or polysilicon. In various further embodiments, acoustic flap 188 may be any type of electrically insulating material with suitable mechanical properties for actuation. In still further embodiments, acoustic flap 188 may include any type of electrically conductive material with an insulating layer. In specific embodiments, acoustic flap 188 is graphene with an insulating layer. In various embodiments, piezoelectric layer 190 extends over only part of the top surface of acoustic flap 188, as shown. In alternative embodiments, piezoelectric layer 190 extends over the entire top surface of acoustic flap 188 (not shown). In alternative embodiments, piezoelectric layer 190 can be shaped in various ways to achieve different transient valve characteristics due to structural or mechanical interactions. For example, piezoelectric layer 190 may be shaped with a solid region, a comb region, a circular region, or another shape in order to adjust the transient valve characteristics.

In various embodiments, acoustic flap 188 seals opening 185 in structural layer 184 and isolation layer 186. When an electrical drive signal, such as a control voltage, is applied to piezoelectric layer 190, piezoelectric layer 190 begins to deform, causing a force on acoustic flap 188. The force on acoustic flap 188 moves acoustic flap 188 to open and allow fluid transport through opening 185. In some embodiments, a first control voltage is applied to piezoelectric layer 190 to close acoustic flap 188 and seal opening 185, and a second control voltage is applied to piezoelectric layer 190 to open acoustic flap 188 and open opening 185.

In various embodiments, isolation layer 186 is an electrically insulating material. In some embodiments, isolation layer 186 is an oxide, nitride, or oxynitride. In particular embodiments, isolation layer 186 is silicon nitride (SiN) or silicon oxide (SiO$_2$). According to various embodiments, structural layer 184 is an electrically conductive or semi-conductive material. In some embodiments, structural layer 184 is a crystalline or amorous semiconductor element or compound. In particular embodiments, structural layer 184 is polysilicon. In other embodiments, structural layer 184 is a metal. In particular embodiments, structural layer 184 is aluminum, platinum, gold, or copper. In various embodiments, structural layer 184 may be a portion of a deflectable membrane, such as described herein in reference to the other figures.

According to various embodiments, acoustic valve 181 includes structural layer 184, isolation layer 186, acoustic flap 192, and piezoelectric layer 194. In such embodiments, acoustic flap 192 is a portion of structural layer 184. Piezoelectric layer 194 may include any of the materials described hereinabove in reference to piezoelectric layer 190 in FIG. 6A. Further, piezoelectric layer 190 may extend over only a portion of the top surface of acoustic flap 192, as shown. In alternative embodiments, piezoelectric layer 190 extends over the entire top surface of acoustic flap 192 (not shown).

According to various embodiments, acoustic valve 182 includes structural layer 184, isolation layer 186, structural support 196, and electrostatic seal layer 198. In such embodiments, a control voltage is applied to electrostatic seal layer 198 in order to generate an electrostatic force that closes electrostatic seal layer 198 and seals opening 185. In various embodiments, electrostatic seal layer 198 is a conductive or semiconductive material. In various particular embodiments, electrostatic seal layer 198 is polysilicon, gold, aluminum, cooper, or platinum. Structural support 196 is formed of an electrically insulating structural material. In some embodiments, structural support 196 is formed oxide, such as tetraethyl orthosilicate (TEOS) oxide.

In various embodiments, in order to generate an electrostatic force on electrostatic seal layer 198, a voltage difference is applied between electrostatic seal layer 198 and structural layer 184. When the voltage difference is applied, electrostatic seal layer 198 seals opening 185 and when no voltage difference is applied, electrostatic seal layer 198 moves away from opening 185 and allows fluid transport through opening 185.

Figure 7A:
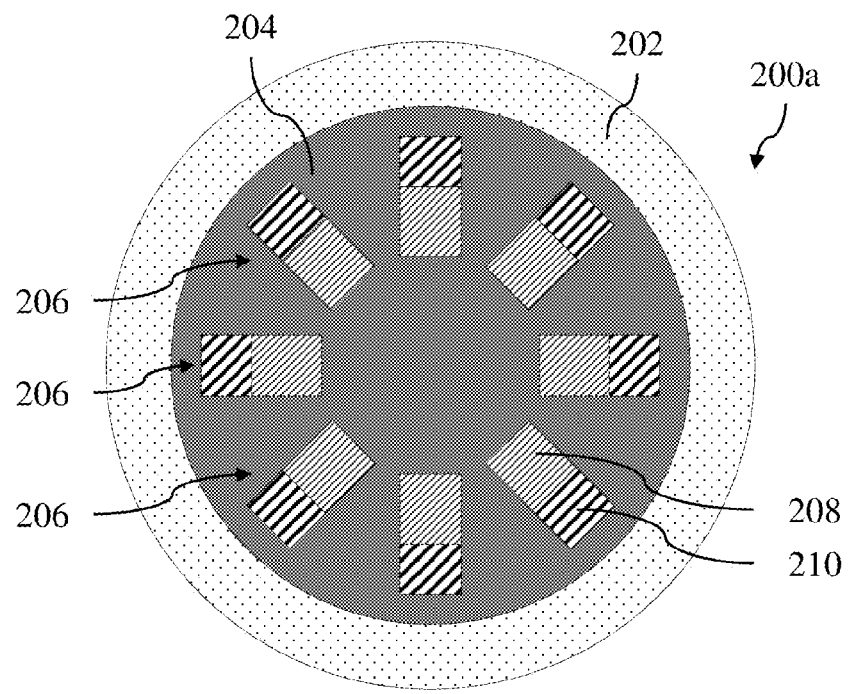
FIGS. 7A, 7B, 7C, and 7D illustrate top views of further embodiment variable flow transducers.

FIGS. 7A, 7B, 7C, and 7D illustrate top views of further embodiment variable flow transducers 200a, 200b, 200c, and 200d. FIG. 7A illustrates variable flow transducer 200a including support structure 202, membrane 204, and acoustic valves 206. According to various embodiments, membrane 204 is driven to oscillate above a higher first frequency and acoustic valves 206 are controlled to open and close in order to shape the positive and negative sound pressures that form acoustic signals with frequencies below a lower second frequency. In some embodiments, membrane 204 may oscillate with a frequency ranging from 40 kHz to 300 kHz and acoustic valves 206 may be opened and closed to form acoustic signals with frequencies ranging from 20 Hz to 20 kHz.

In such embodiments, acoustic valves 206 may be implemented as described hereinabove in reference to acoustic valves 114, 160, 180, 181, or 182 in reference to the other figures. In particular embodiments, acoustic valves 206 correspond to acoustic valve 180 or acoustic valve 181 as described hereinabove in reference to FIGS. 6A and 6B, respectively. In specific embodiments, acoustic valves 206 include acoustic flaps 208 and piezoelectric actuation layers 210 formed on a top surface of the acoustic flap 208.

In various embodiments, support structure 202 may be a substrate, such as described hereinabove in reference to substrate 152 in FIGS. 5A and 5B. In other embodiments, support structure 202 may be an oxide, such as a TEOS oxide, or a polymer. In such embodiments, support structure 202 may be formed on a substrate. Membrane 204 may include any of the structures and materials as described hereinabove in reference to membrane 154 or membrane 168 in FIGS. 5A and 5B, respectively. In various embodiments a cavity is formed in the substrate below membrane 204.

Figure 7B:
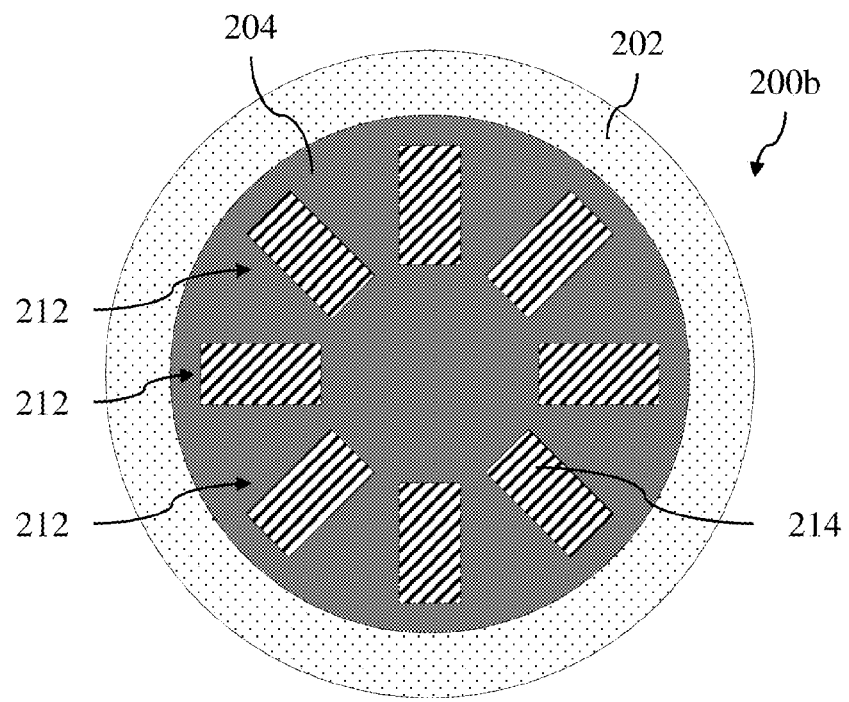

FIG. 7B illustrates variable flow transducer 200b including support structure 202, membrane 204, and acoustic valves 212. According to various embodiments, variable flow transducer 200b is similar to variable flow transducer 200a, with the exception that acoustic valves 206, which are piezoelectrically actuated, are replaced by acoustic valves 212, which are electrostatically actuated. In such embodiments, acoustic valves 212 correspond to acoustic valve 182 as described hereinabove in reference to FIG. 6C. Acoustic valves 212 include electrostatic seal layer 214.

Figure 7C:
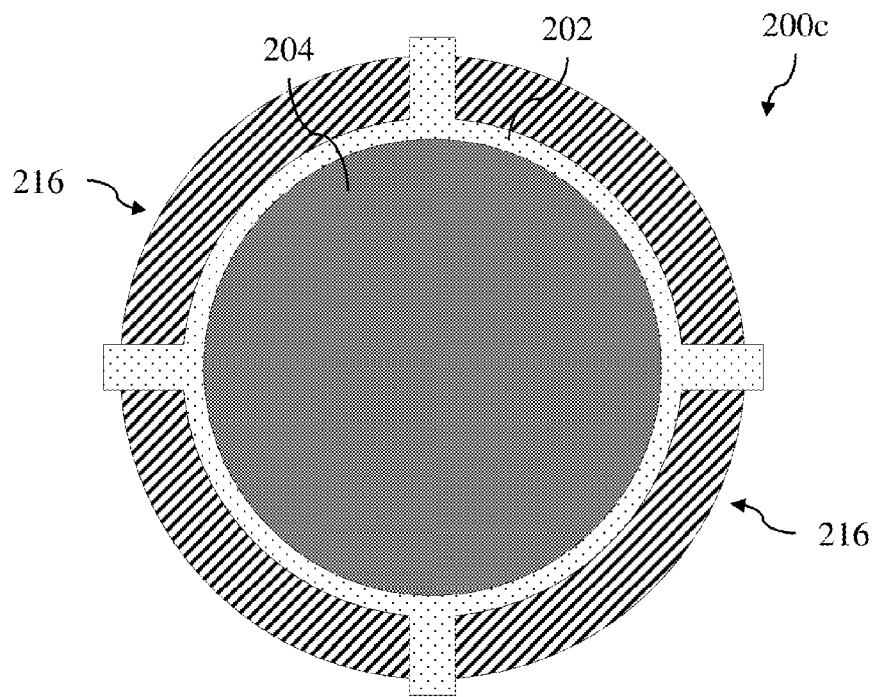

FIG. 7C illustrates variable flow transducer 200c including support structure 202, membrane 204, and acoustic valves 216. According to various embodiments, acoustic valves 216 are formed in support structure 202 around membrane 204. In such embodiments, acoustic valves 216 correspond to bypass route 166, bypass structure 162, and acoustic valves 160 in bypass structure 162 as described hereinabove in reference to FIGS. 5A and 5B.

In particular embodiments, acoustic valves 216 may be implemented as described hereinabove in reference to acoustic valves 114, 160, 180, 181, or 182 in reference to the other figures. In such embodiments, acoustic valves 216 may include multiple separate acoustic valves, such as with square acoustic flaps or continuous curved acoustic valves surrounding the perimeter of membrane 204. Acoustic valves 216 may be electrostatically or piezoelectrically actuated in different embodiments. In other embodiments, membrane 204 may also include acoustic valves (not shown), such as described hereinabove in reference to variable flow transducer 200a and variable flow transducer 200b in FIGS. 7A and 7B, respectively.

Figure 7D:
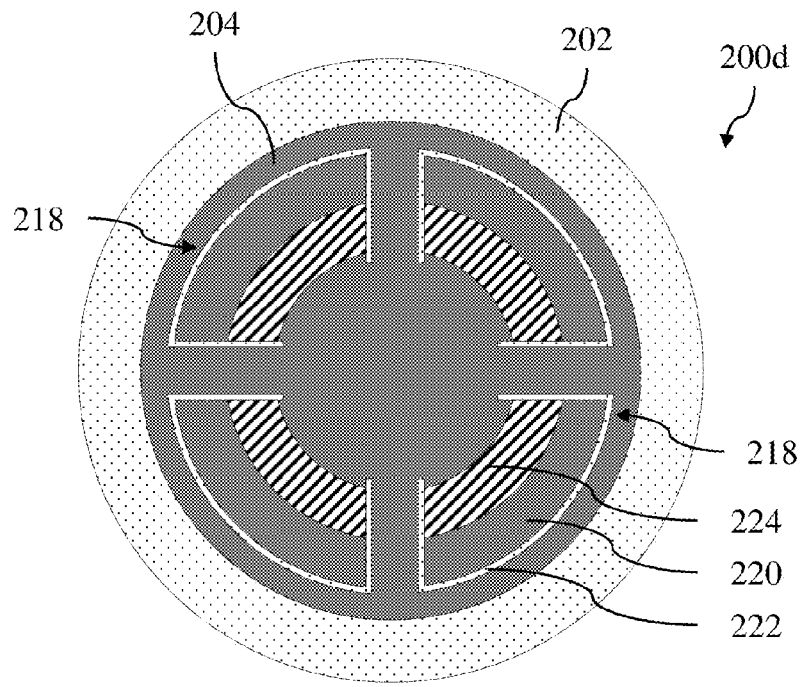

FIG. 7D illustrates variable flow transducer 200d including support structure 202, membrane 204, and acoustic flaps 220. According to various embodiments, acoustic valves 218 are formed in membrane 204. Membrane slits 222 in membrane 204 allow acoustic flaps 220 to deflect separately from membrane 204. In such embodiments, piezoelectric actuation layers 224 are formed on a top surface of membrane 204 and cause acoustic flaps 220 to deflect when a control signal, such as an actuation voltage is applied to piezoelectric actuation layers 224. In various embodiments, acoustic valves 218 correspond to acoustic valve 181 as described hereinabove in reference to FIG. 6B. In other embodiments, variable flow transducer 200d and acoustic valves 218 may be modified to correspond to acoustic valve 180 as described hereinabove in reference to FIG. 6A.

In various embodiments, variable flow transducers 200a, 200b, 200c, and 200d include circular membranes, as shown. In other embodiments, variable flow transducers 200a, 200b, 200c, and 200d may include oval or rectangular membranes (not shown). In still further embodiments, variable flow transducers 200a, 200b, 200c, and 200d may include any shape of membrane, such as hexagonal or octagonal, for example.

FIGS. 8A and 8B illustrate side view cross-sections of more embodiment variable flow transducers 111a and 111b. Variable flow transducers 111a and 111b each include membrane 112, acoustic valves 114, and actuating structures 116 as described hereinabove in reference to variable flow transducer 110 in FIGS. 3A, 3B, and 3C. According to various embodiments, acoustic valves 114 are included in various different numbers and configurations. Specifically, variable flow transducer 111a includes acoustic valves 114 are arranged in central region 123a, as shown in FIG. 8A. In such embodiments, peripheral region 123b is solid. In various embodiments, the deflection of membrane 112 is largest near the center and smallest near the anchor.

In other embodiments, variable flow transducer 111b includes acoustic valves 114 arranged in peripheral region 123b, as shown in FIG. 8B. In such embodiments, central region 123a is solid. In such embodiments, actuating structures 116 may be formed on the top surface of membrane 112 at the edge of central region 123a. According to various embodiments, any number and arrangement of acoustic valves may be arranged in any portion of membrane. Further, FIGS. 7A and 7B illustrate only a single row of acoustic valves arranged in a circle on membrane 204, but various other embodiments may include two, three, or more acoustic valves arranged in concentric circles on a membrane, such as illustrated for variable flow transducer 111a and variable flow transducer 111b in FIGS. 8A and 8B, respectively. Those having skill in the art will readily appreciate various modifications of the number and configuration of embodiment acoustic valves for embodiment variable flow transducers. Such modifications are well within the scope of the embodiments described herein.

Figure 9A:
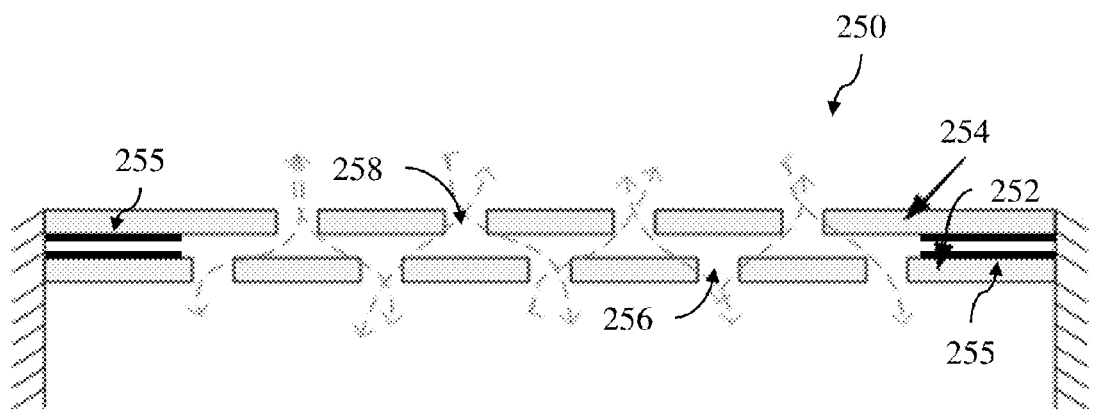
FIGS. 9A, 9B, and 9C illustrate side view cross-sections and a top view of another embodiment variable flow transducer.
Figure 9B:
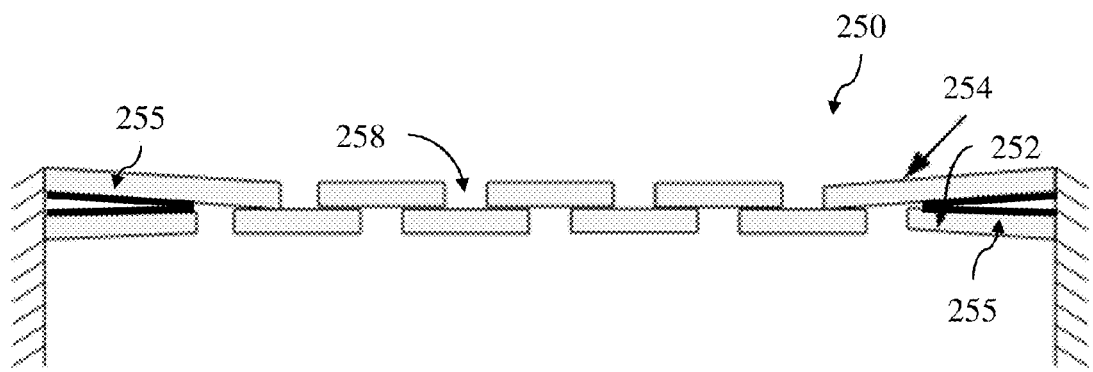
Figure 9C:
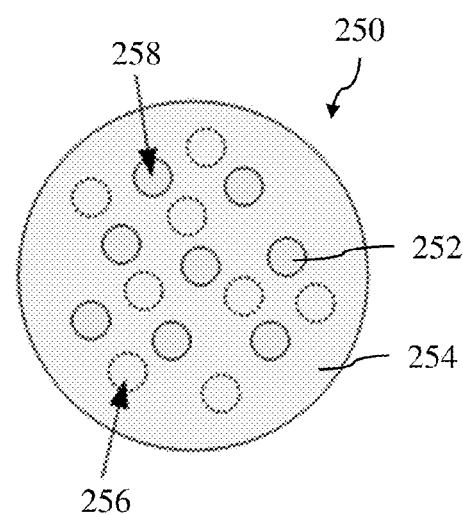

FIGS. 9A, 9B, and 9C illustrate side view cross-sections and a top view of another embodiment variable flow transducer 250 including bottom membrane 252 and top membrane 254. According to various embodiments, bottom membrane 252 includes acoustic vents 256 and top membrane 254 includes acoustic vents 258. Acoustic vents 256 and acoustic vents 258 are offset so that the vents do not overlap. In such embodiments, when a voltage difference is applied between bottom membrane 252 and top membrane 254, an electrostatic force attracts bottom membrane 252 and top membrane 254 together and seals acoustic vents 256 and acoustic vents 258, as shown in FIG. 9B. When no voltage difference or a small voltage difference is applied between bottom membrane 252 and top membrane 254, the membranes stay separated and acoustic vents 256 and acoustic vents 258 are open, as shown in FIG. 9A.

According to various embodiments, when acoustic vents 256 and acoustic vents 258 are sealed, bottom membrane 252 and top membrane 254 are acoustically solid, i.e., acoustically visible or acoustically opaque. When acoustic vents 256 and acoustic vents 258 are open, bottom membrane 252 and top membrane 254 are acoustically transparent.

In various embodiments, bottom membrane 252 and top membrane 254 are driven to oscillate above a higher first frequency and acoustic vents 256 and acoustic vents 258 are controlled to open and seal in order to shape the positive and negative sound pressures that form acoustic signals with frequencies below a lower second frequency. In some embodiments, bottom membrane 252 and top membrane 254 may oscillate with a frequency ranging from 40 kHz to 300 kHz and acoustic vents 256 and acoustic vents 258 may be opened and sealed to form acoustic signals with frequencies ranging from 20 Hz to 20 kHz.

An embodiment arrangement of acoustic vents 256 and acoustic vents 258 is shown in FIG. 9C. In various embodiments, acoustic vents 256 and acoustic vents 258 may be arranged in any type of random arrangement or nonrandom pattern.

According to various embodiments, bottom membrane 252 and top membrane 254 are driven to oscillate either piezoelectrically or electrostatically. Specifically, bottom membrane 252 and top membrane 254 may be arranged with top or bottom perforated backplates or piezoelectric actuation layers, such as described hereinabove in reference to variable flow transducer 150 and variable flow transducer 151 in FIGS. 5A and 5B, respectively. In such embodiments, bottom membrane 252 and top membrane 254 are driven together to oscillate at the higher frequency above the audible frequency range.

According to alternative embodiments, bottom membrane 252 and top membrane 254 may be actuated to open and seal acoustic vents 256 and acoustic vents 258 piezoelectrically. In such embodiments, optional piezoelectric actuation layers 255 are formed on bottom membrane 252 and top membrane 254 in order to provide forces to open and seal acoustic vents 256 and acoustic vents 258.

Figure 10A:
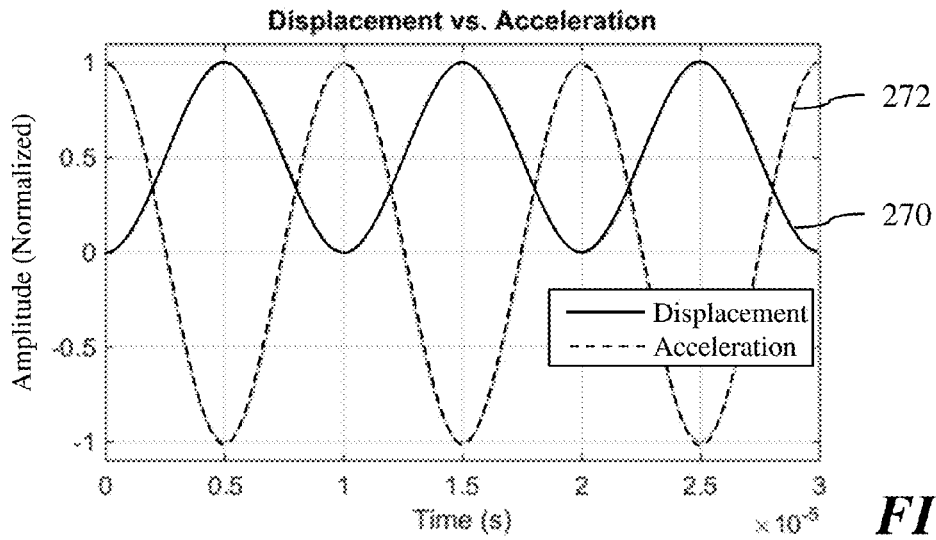
FIGS. 10A, 10B, and 10C illustrate waveform diagrams of embodiment variable flow transducer operation.
Figure 10B:
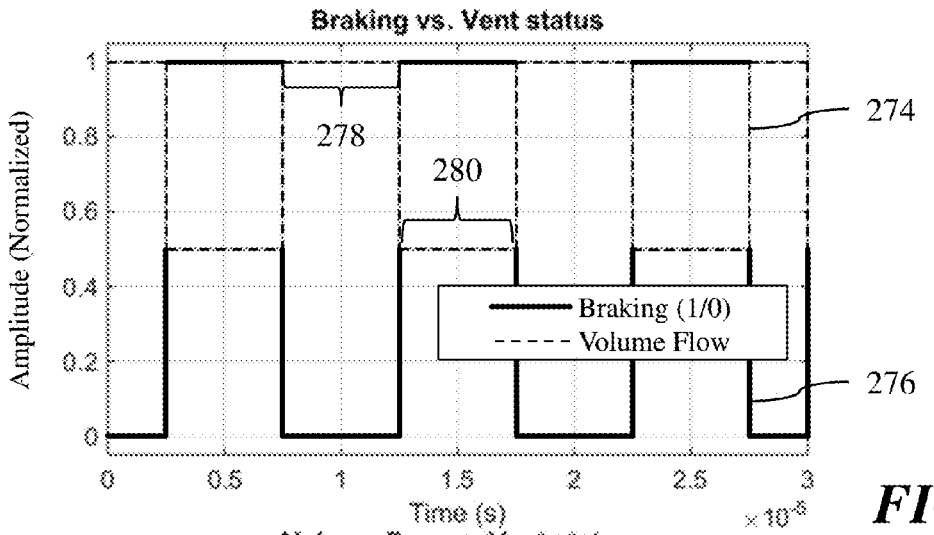
Figure 10C:
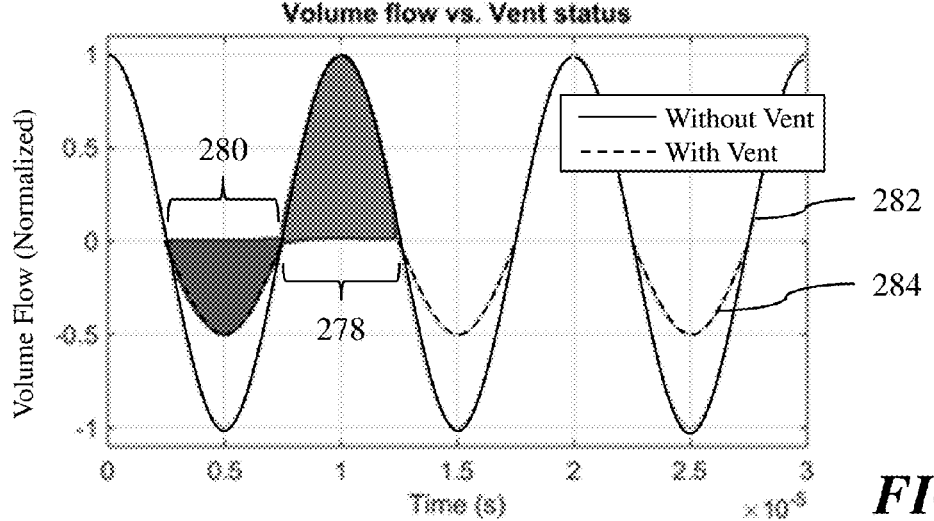

FIGS. 10A, 10B, and 10C illustrate waveform diagrams of embodiment variable flow transducer operation. FIGS. 10A, 10B, and 10C include waveform diagrams shown on a normalized vertical axis versus time. FIG. 10A illustrates membrane displacement waveform 270 and membrane acceleration waveform 272, as similarly described hereinabove in reference to membrane displacement waveform 134 and membrane acceleration waveform 136 in FIG. 4C. According to various embodiments, a membrane is driven, piezoelectrically or electrostatically, to oscillate at a frequency or frequencies above the audible range. For example, the membrane may be driven to oscillate at a resonant frequency of the membrane, such as, e.g., 100 kHz.

In various embodiments, the acoustic impedance of the membrane is adjusted during the oscillations in order to generate a modulated acoustic signal. In some embodiments, acoustic valves are opened when the membrane is decelerating, which may be referred to as braking. FIG. 10B illustrates braking waveform 276 and volume flow waveform 274, which correspond to accelerations and decelerations of membrane acceleration waveform 272 in FIG. 10A.

When the membrane is decelerating, i.e., when braking waveform 276 has a value of 1, the acoustic valves are open. In such embodiments, the membrane is acoustically transparent, e.g., the acoustic impedance is decreased, and the volume flow of the acoustic medium, e.g., air, is decreased as shown by volume flow waveform 274. In some embodiments, during braking period 280, when braking waveform 276 has a value of 1, the volume flow is half, as shown by volume flow waveform 274. In such embodiments, the membrane is 50% acoustically transparent during braking period 280 when the acoustic valves are open. In other embodiments, the membrane may have other values for acoustic transparency. In various embodiments, the membrane is between 30% and 95% acoustically transparent when the acoustic valves are open. In specific embodiments, the membrane is between 50% and 80% acoustically transparent when the acoustic valves are open. In such various embodiments, the volume flow corresponds to the acoustic transparency. In some embodiments, acoustic transparence may also be referred to as an acoustic short circuit.

When the membrane is accelerating, i.e., when braking waveform 276 has a value of 0, the acoustic valves are closed. In such embodiments, the membrane is acoustically opaque, e.g., the acoustic impedance is increased or at a maximum, and the volume flow of the acoustic medium, e.g., air, is increased as shown by volume flow waveform 274. In some embodiments, during accelerating period 278, when braking waveform 276 has a value of 0, the volume flow is full, as shown by volume flow waveform 274.

FIG. 10C illustrates 100% volume flow waveform 282 and 50% volume flow waveform 284, corresponding to braking waveform 276 and volume flow waveform 274 in FIG. 10B. The volume flow for a membrane without embodiment acoustic valves, as described herein, may be equal for positive displacements (1,0) and negative displacements (0,−1) as shown by 100% volume flow waveform 282. According to various embodiments, the volume flow for a membrane with embodiment acoustic valves, as described herein, may be controlled to have different values for positive displacements (1,0) and negative displacements (0,−1) as shown by 50% volume flow waveform 284. In particular embodiments, the membrane is 50% acoustically transparent when the acoustic valves are open, such as during braking, which produces 50% of the volume flow (for negative values of 50% volume flow waveform 284). When the acoustic valves are closed, such as during accelerating, the membrane is acoustically opaque, which produces 100% of the volume flow (for positive values of 50% volume flow waveform 284).

According to various embodiments, the polarity of the acoustic valve control may be switched in order to shape both positive and negative half-waves of an audible acoustic signal. By opening and closing the acoustic valves strategically, positive and negative sound pressure levels may be shaped from higher frequency oscillations. In various embodiments, the quality of the acoustic transparency, which may be referred to as the acoustic impedance or acoustic short circuit, is related to the number, size, shape, distribution, and operation of the acoustic valves as described hereinabove in reference to the other figures.

Figure 11:
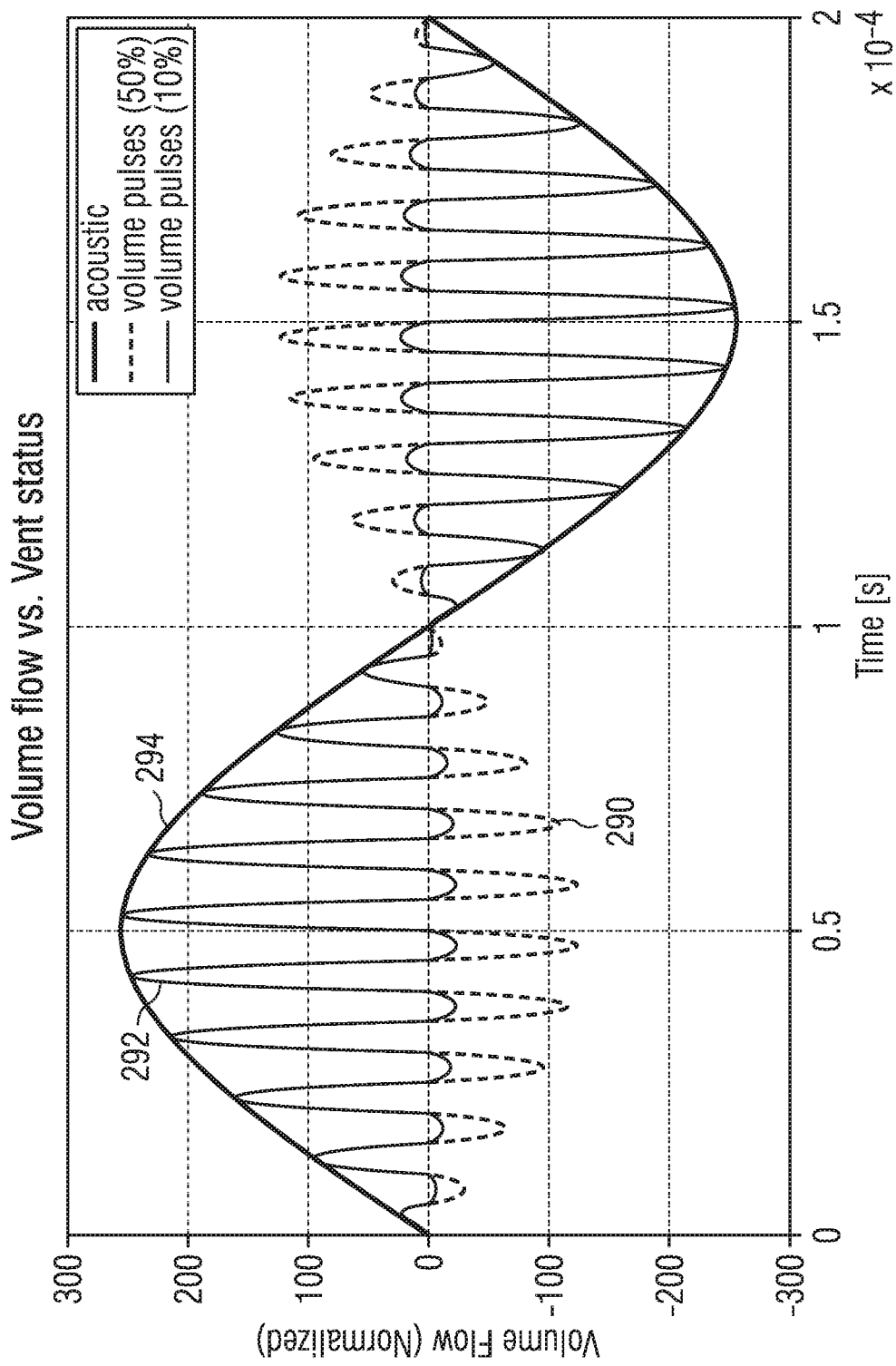
FIG. 11 illustrates an additional waveform diagram of embodiment variable flow transducer operation.

FIG. 11 illustrates an additional waveform diagram of embodiment variable flow transducer operation including high frequency waveform 290, high frequency waveform 292, and modulated acoustic waveform 294. According to various embodiments, high frequency waveform 290 and high frequency waveform 292 are carrier signals having frequencies above the audible frequency range, such as described hereinabove in reference to carrier signal $C_{SIG}$ in FIG. 2B. Modulated acoustic waveform 294 is a modulated signal formed from high frequency waveform 290 or high frequency waveform 292, such as described hereinabove in reference to modulated acoustic signal $MA_{SIG}$ in FIG. 2B.

According to various embodiments, the quality of the acoustic valves, and the corresponding acoustic pathways or perforations in the membrane, affects the acoustic transparency of the membrane. In particular embodiments, high frequency waveform 290 corresponds to a membrane that is 50% acoustically visible (50% acoustically transparent) when the acoustic pathways or valves are open and high frequency waveform 292 corresponds to a membrane that is 10% acoustically visible (90% acoustically transparent) when the acoustic pathways or valves are open. In such embodiments, the membrane produces full volume flow in the positive acceleration state and reduced volume flow in the negative acceleration state due to the acoustic transparency during the first half-wave from 0 to 0.1 ms. Further, the membrane produces full volume flow in the negative acceleration state and reduced volume flow in the positive acceleration state due to the acoustic transparency during the second half-wave from 0.1 ms to 0.2 ms. The volume flow when the acoustic valves are open is not negligible for the 50% acoustically visible membrane, but is dominated by the larger amount of volume flow when the acoustic valves are closed. As shown by high frequency waveform 290 and high frequency waveform 292, the volume flow when the acoustic valves are open is much greater for the membrane that is 50% acoustically visible than for the membrane that is 10% acoustically visible.

According to various embodiments, modulated acoustic waveform 294 is formed or shaped by high frequency waveform 290 or high frequency waveform 292. In various embodiments, the amplitude of modulated acoustic waveform 294 may be dependent on the amplitude of high frequency waveform 290 or high frequency waveform 292 as well as the extent of the acoustic transparency of the membrane when the acoustic valves are open.

Figure 12:
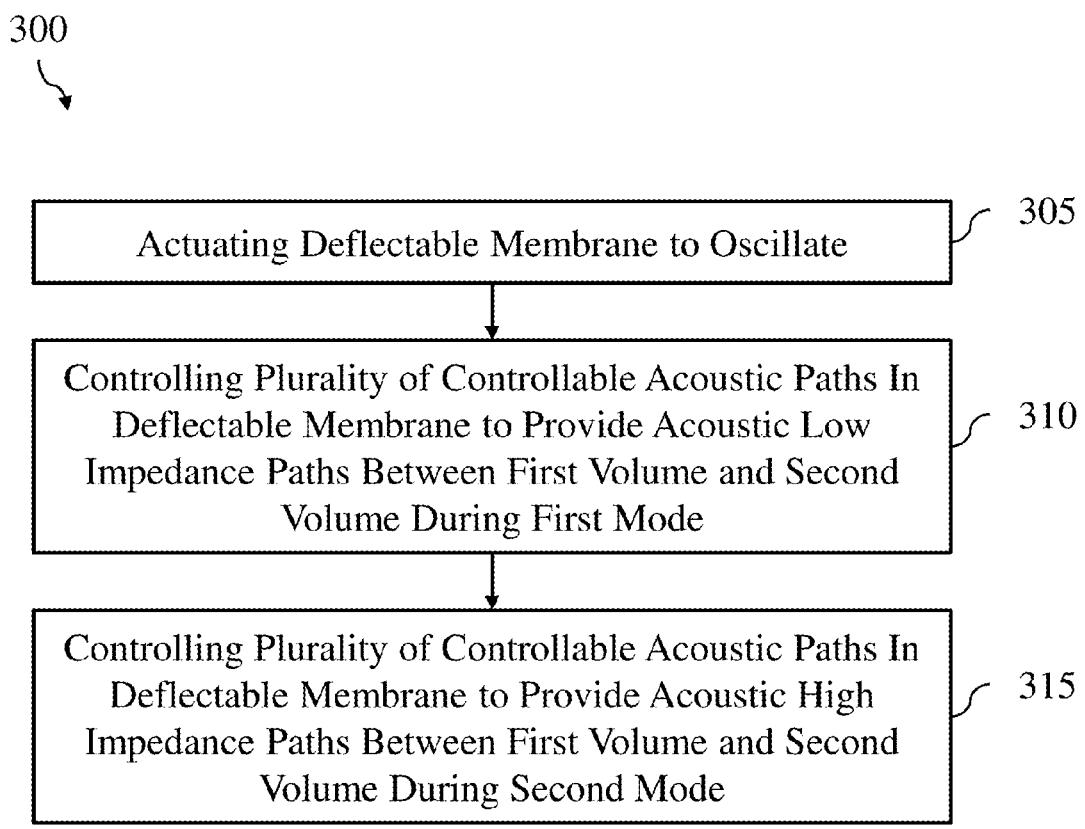
FIG. 12 illustrates a flowchart diagram of embodiment method of operation for a variable flow transducer.

FIG. 12 illustrates a flowchart diagram of embodiment method of operation 300 for a variable flow transducer. According to various embodiments, a method of operation 300 is a method of operating a MEMS transducer, where the method includes steps 305, 310, and 315. In such embodiments, step 305 includes actuating a deflectable membrane to oscillate. The deflectable membrane may oscillate with a frequency or frequencies above the audible range. For example, in particular embodiments, the deflectable membrane oscillates with a frequency or frequencies ranging from 40 kHz to 300 kHz.

In various embodiments, step 310 includes controlling a plurality of controllable acoustic paths in the deflectable membrane to provide acoustic low impedance paths between a first volume and a second volume during a first mode. The acoustic paths may include controllable acoustic valves as described hereinabove in reference to the other figures. Providing the low impedance paths may include opening the acoustic valves in some embodiments. Step 315 includes controlling the plurality of controllable acoustic paths in the deflectable membrane to provide acoustic high impedance paths between the first volume and the second volume during a second mode. Providing the high impedance paths may include closing the acoustic valves in some embodiments. In such embodiments, the high impedance path may include a very large acoustic impedance.

According to an embodiment, a microelectromechanical systems MEMS transducer includes a deflectable membrane attached to a support structure, an acoustic valve structure configured to cause the deflectable membrane to be acoustically transparent in a first mode and acoustically visible in a second mode, and an actuating mechanism coupled to the deflectable membrane. Other embodiments include corresponding systems and apparatus, each configured to perform various embodiment methods.

In various embodiments, the actuating mechanism is configured to excite oscillations of the deflectable membrane, the oscillations having a frequency above 40 kHz. The MEMS transducer may further include a substrate, where the support structure is disposed on the substrate. In some embodiments, the acoustic valve structure includes a plurality of piezoelectric valves. In such embodiments, the plurality of piezoelectric valves may be formed on the deflectable membrane.

In various embodiments, the acoustic valve structure includes a plurality of electrostatic valves. In such embodiments, the plurality of electrostatic valves may be formed on the deflectable membrane. In some embodiments, the actuating mechanism includes a perforated backplate separated from the deflectable membrane by a separation distance. In other embodiments, the actuating mechanism includes a piezoelectric layer formed on the deflectable membrane.

According to an embodiment, a MEMS transducer includes a support structure disposed on a substrate, a deflectable membrane supported by the support structure and separating a first volume from a second volume, and an actuation structure coupled to the deflectable membrane. The deflectable membrane includes a plurality of controllable acoustic paths in the deflectable membrane, where each controllable acoustic path of the plurality of controllable acoustic paths is configured to provide an acoustic low impedance path between the first volume and the second volume during a first mode, and provide an acoustic high impedance path between the first volume and the second volume during a second mode. Other embodiments include corresponding systems and apparatus, each configured to perform various embodiment methods.

In various embodiments, the actuation structure is configured to excite the deflectable membrane to oscillate with a frequency above 40 kHz. In some embodiments, the MEMS transducer further includes a control circuit coupled to the actuation structure and configured to provide first control signals to the actuation structure. In such embodiments, the control circuit is may be further configured to provide second control signals to the plurality of controllable acoustic paths, and the second control signals are operable to switch the plurality of controllable acoustic paths between the first mode and the second mode in order to selectively generate positive and negative sound pressures forming audible acoustic signals with frequencies below 20 kHz while the deflectable membrane oscillates with the frequency above 40 kHz.

In various embodiments, the plurality of controllable acoustic paths includes a plurality of piezoelectric valves formed in the deflectable membrane. In some embodiments, the plurality of controllable acoustic paths includes a plurality of electrostatic valves formed in the deflectable membrane.

According to an embodiment, a method of operating a MEMS transducer includes actuating a deflectable membrane to oscillate, controlling a plurality of controllable acoustic paths in the deflectable membrane to provide acoustic low impedance paths between a first volume and a second volume during a first mode, and controlling the plurality of controllable acoustic paths in the deflectable membrane to provide acoustic high impedance paths between the first volume and the second volume during a second mode. Other embodiments include corresponding systems and apparatus, each configured to perform various embodiment methods.

In various embodiments, the deflectable membrane is actuated to oscillate with a frequency above 40 kHz. In some embodiments, the method further includes selectively generating positive and negative sound pressures by switching the plurality of controllable acoustic paths between the first mode and the second mode, the positive and negative sound pressures forming audible acoustic signals with frequencies below 20 kHz while the deflectable membrane oscillates with the frequency above 40 kHz.

In various embodiments, controlling the plurality of controllable acoustic paths in the deflectable membrane to provide acoustic low impedance paths may include piezo-electrically opening a plurality of piezoelectric acoustic valves, and controlling the plurality of controllable acoustic paths in the deflectable membrane to provide acoustic high impedance paths may include piezoelectrically closing a plurality of piezoelectric acoustic valves. In some embodiments, controlling the plurality of controllable acoustic paths in the deflectable membrane to provide acoustic low impedance paths includes electrostatically opening a plurality of electrostatic acoustic valves, and controlling the plurality of controllable acoustic paths in the deflectable membrane to provide acoustic high impedance paths includes electrostatically closing a plurality of electrostatic acoustic valves.

According to an embodiment, a MEMS transducer includes a first deflectable membrane attached to a support structure and including a first plurality of perforations, a second deflectable membrane attached to the support structure and including a second plurality of perforations, a closing mechanism coupled to the first deflectable membrane and the second deflectable membrane, and an actuating mechanism configured to excite oscillations of the first deflectable membrane and the second deflectable membrane. The second plurality of perforations are offset from the first plurality of perforations. The closing mechanism is configured to close an acoustic path through the first deflectable membrane and the second deflectable membrane by moving the first deflectable membrane and the second deflectable membrane into contact during a first mode and open the acoustic path by moving the first deflectable membrane and the second deflectable membrane out of contact during a second mode. In such embodiments, the first plurality of perforations are sealed to the second deflectable membrane and the second plurality of perforations are sealed to the first deflectable membrane when the acoustic path is closed. Other embodiments include corresponding systems and apparatus, each configured to perform various embodiment methods.

In various embodiments, the oscillations of the first deflectable membrane and the second deflectable membrane have a frequency above 40 kHz. In some embodiments, the closing mechanism includes an electrostatic structure configured to generate an electrostatic force between the first deflectable membrane and the second deflectable membrane during the first mode. In other embodiments, the closing mechanism includes a piezoelectric structure configured to generate a first force on the first deflectable membrane and a second force on the second deflectable membrane during the first mode, the first force and the second force configured to move the first deflectable membrane and the second deflectable membrane into contact.

In various embodiments, the actuating mechanism may include a perforated backplate attached to the support structure and configured to generate an electrostatic force between the perforated backplate and the first deflectable membrane and the second deflectable membrane. In other embodiments, the actuating mechanism includes a piezoelectric structure configured to generate a first force on the first deflectable membrane and a second force on the second deflectable membrane.

Advantages of various embodiments described herein may include high sound pressure level signals with low frequencies that are formed using higher frequency oscillations of a membrane. Other advantages of various embodiments described herein may include deflectable membranes with controllable acoustic impedance. Some advantages of various embodiments may include the ability to form positive sound pressures without, or with reduced, negative sound pressures or the ability to form negative sound pressures without, or with reduced, positive sound pressures.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectromechanical systems (MEMS) transducer comprising:
   a deflectable membrane attached to a support structure;
   an acoustic valve structure configured to cause the deflectable membrane to be acoustically transparent in a first mode and acoustically visible in a second mode; and
   an actuating mechanism coupled to the deflectable membrane; and
   a controller configured to cause the deflectable membrane to vibrate at a first frequency, and to cause the acoustic valve structure to alternate between the first mode and the second mode to produce an acoustic signal having a second frequency lower than the first frequency at the same time the deflectable membrane vibrates at the first frequency.

2. The MEMS transducer of claim 1, wherein the actuating mechanism is configured to excite oscillations of the deflectable membrane, the oscillations having a frequency above 40 kHz.

3. The MEMS transducer of claim 1, further comprising a substrate, wherein the support structure is disposed on the substrate.

4. The MEMS transducer of claim 1, wherein the acoustic valve structure comprises a plurality of piezoelectric valves.

5. The MEMS transducer of claim 4, wherein the plurality of piezoelectric valves are formed on the deflectable membrane.

6. The MEMS transducer of claim 1, wherein the acoustic valve structure comprises a plurality of electrostatic valves.

7. The MEMS transducer of claim 6, wherein the plurality of electrostatic valves are formed on the deflectable membrane.

8. The MEMS transducer of claim 1, wherein the actuating mechanism comprises a perforated backplate separated from the deflectable membrane by a separation distance.

9. The MEMS transducer of claim 1, wherein the actuating mechanism comprises a piezoelectric layer formed on the deflectable membrane.

10. A microelectromechanical systems (MEMS) transducer comprising:
    a support structure disposed on a substrate;
    a deflectable membrane supported by the support structure and separating a first volume from a second volume, the deflectable membrane comprising a plurality of controllable acoustic paths in the deflectable membrane, wherein each controllable acoustic path of the plurality of controllable acoustic paths is configured to
       provide an acoustic low impedance path between the first volume and the second volume during a first mode, and
       provide an acoustic high impedance path between the first volume and the second volume during a second mode;
    an actuation structure coupled to the deflectable membrane, wherein the activation structure is configured to excite the deflectable membrane to oscillate at a first frequency; and
    a control circuit coupled to the actuation structure and configured to provide first control signals to the actuation structure and second control signals to the plurality of controllable acoustic paths, wherein the second control signals are operable to switch the plurality of controllable acoustic paths between the first mode and the second mode in order to selectively generate positive and negative sound pressures forming audible acoustic signals having a second frequency lower than the first frequency at the same time that the deflectable membrane oscillates at the first frequency.

11. The MEMS transducer of claim 10, wherein the first frequency is above 40 kHz.

12. The MEMS transducer of claim 11, wherein the second frequency is below 20 KHz.

13. The MEMS transducer of claim 10, wherein the plurality of controllable acoustic paths comprises a plurality of piezoelectric valves formed in the deflectable membrane.

14. The MEMS transducer of claim 10, wherein the plurality of controllable acoustic paths comprises a plurality of electrostatic valves formed in the deflectable membrane.

15. A method of operating a microelectromechanical systems (MEMS) transducer, the method comprising:
    actuating a deflectable membrane to oscillate;
    controlling a plurality of controllable acoustic paths in the deflectable membrane to provide acoustic low impedance paths between a first volume and a second volume during a first mode;
    controlling the plurality of controllable acoustic paths in the deflectable membrane to provide acoustic high impedance paths between the first volume and the second volume during a second mode, wherein the deflectable membrane is actuated to oscillate with a first frequency; and
    selectively generating positive and negative sound pressures by switching the plurality of controllable acoustic paths between the first mode and the second mode, the positive and negative sound pressures forming audible acoustic signals having a second frequency lower than the first frequency at the same time the deflectable membrane oscillates at the first frequency.

16. The method of claim 15, wherein the first frequency is above 40 kHz.

17. The method of claim 16, wherein the second frequency is below 20 KHz.

18. The method of claim 15, wherein
    controlling the plurality of controllable acoustic paths in the deflectable membrane to provide acoustic low impedance paths comprises piezoelectrically opening a plurality of piezoelectric acoustic valves; and
    controlling the plurality of controllable acoustic paths in the deflectable membrane to provide acoustic high impedance paths comprises piezoelectrically closing the plurality of piezoelectric acoustic valves.

19. The method of claim 15, wherein
    controlling the plurality of controllable acoustic paths in the deflectable membrane to provide acoustic low impedance paths comprises electrostatically opening a plurality of electrostatic acoustic valves; and
    controlling the plurality of controllable acoustic paths in the deflectable membrane to provide acoustic high impedance paths comprises electrostatically closing the plurality of electrostatic acoustic valves.

20. The MEMS transducer of claim 1, wherein the first frequency is higher than 40 KHz, and the second frequency is lower than 20 KHz.

* * * * *